(12) United States Patent
Hamamoto et al.

(10) Patent No.: US 7,732,271 B2
(45) Date of Patent: Jun. 8, 2010

(54) METHOD FOR MANUFACTURING NAND-TYPE SEMICONDUCTOR STORAGE DEVICE

(75) Inventors: Takeshi Hamamoto, Yokohama (JP); Akihiro Nitayama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1 day.

(21) Appl. No.: 12/222,143

(22) Filed: Aug. 4, 2008

(65) Prior Publication Data

US 2008/0305588 A1    Dec. 11, 2008

Related U.S. Application Data

(62) Division of application No. 11/655,060, filed on Jan. 19, 2007, now Pat. No. 7,423,313.

(30) Foreign Application Priority Data

Jan. 19, 2006  (JP)  ............................. 2006-011332
Jan. 15, 2007  (JP)  ............................. 2007-005807

(51) Int. Cl.
*H01L 21/8238* (2006.01)

(52) U.S. Cl. ................. 438/201; 438/221; 257/E21.54; 257/E29.129

(58) Field of Classification Search ................. 438/201, 438/211, 257, 593, 311, 221; 257/315, 347, 257/349, E29.129, E27.112, E21.54
See application file for complete search history.

(56) References Cited

U.S. PATENT DOCUMENTS 5,440,161 A * 8/1995 Iwamatsu et al. ........... 257/349
6,433,384 B1 * 8/2002 Hashimoto .................. 257/316

(Continued)

FOREIGN PATENT DOCUMENTS

JP    3-96278    4/1991

(Continued)

OTHER PUBLICATIONS

Yeo, et al., 80 nm 512M DRAM with Enhanced Data Retention Time Using Partially-Insulated Cell Array Transistor (PiCAT), 2004 Symposium on VLSI Technology, Digest of Technical Papers, pp. 30-31, (2004).

(Continued)

*Primary Examiner*—Khiem D Nguyen
(74) *Attorney, Agent, or Firm*—Finnegan, Henderson, Farabow, Garrett & Dunner, L.L.P.

(57) ABSTRACT

According to this invention, there is provided a NAND-type semiconductor storage device including a semiconductor substrate, a semiconductor layer formed on the semiconductor substrate, a buried insulating film selectively formed between the semiconductor substrate and the semiconductor layer in a memory transistor formation region, diffusion layers formed on the semiconductor layer in the memory transistor formation region, floating body regions between the diffusion layers, a first insulating film formed on each of the floating body regions, a floating gate electrode formed on the first insulating film, a control electrode on a second insulating film formed on the floating gate electrode, and contact plugs connected to ones of the pairs of diffusion layers which are respectively located at ends of the memory transistor formation region, wherein the ones of the pairs of diffusion layers, which are located at the ends of the memory transistor formation region, are connected to the semiconductor substrate below the contact plugs.

9 Claims, 30 Drawing Sheets

U.S. PATENT DOCUMENTS 6,573,583 B2 * 6/2003 Hokazono ................ 257/486
6,787,853 B2   9/2004 Hidaka et al.

FOREIGN PATENT DOCUMENTS

| JP | 10-41413 | 2/1998 |
| JP | 11-163303 | 6/1999 |
| JP | 2000-174241 | 6/2000 |
| JP | 2005-303305 | 10/2005 |
| JP | 2006-73939 | 3/2006 |

OTHER PUBLICATIONS

Notification of Reasons for Rejection issued by the Japanese Patent Office on Sep. 25, 2009, for Japanese Patent Application No. 2007-005807, and English-language translation thereof.

* cited by examiner

610

610

610

610

610

610

610

610

METHOD FOR MANUFACTURING NAND-TYPE SEMICONDUCTOR STORAGE DEVICE

CROSS REFERENCE TO RELATED APPLICATIONS

This is a division of Application No. 11/655,060, filed Jan. 19, 2007, now issued as U.S. Pat. No. 7,423,313.

This application is based upon and claims benefit of priority under 35 USC 119 from the Japanese Patent Applications No. 2006-11332, filed on Jan. 19, 2006 and No. 2007-5807, filed on Jan. 15, 2007, the entire contents of which are incorporated herein by reference.

BACKGROUND OF THE INVENTION

The present invention relates to a NAND-type semiconductor storage device and a method for manufacturing the same.

There have conventionally been developed NAND-type flash memories as nonvolatile semiconductor memories. A memory cell transistor of a NAND-type flash memory has a structure in which a floating gate electrode formed above a semiconductor substrate via a tunnel insulating film and a control gate electrode formed above the floating gate electrode via an interelectrode insulating film are stacked.

A NAND-type flash memory is formed by series-connecting pairs of source and drain regions of a plurality of memory cell transistors between two selection transistors and connecting one of the selection transistors to a bit line and the other to a source line. A control gate electrode of each memory cell transistor serves as a part of a word line.

An element isolation insulating film (i.e., an element isolation region) is formed between memory cell transistors which are adjacent to each other in the direction of a corresponding word line, and the memory cell transistors adjacent in the direction of the word line are isolated from each other by the element isolation insulating film. An interlayer insulating film is formed between a piece of wiring such as the bit line and the semiconductor substrate.

In this case, the NAND-type flash memory has various problems such as variations in gate threshold voltage caused by a parasitic capacitance which occurs between the piece of wiring and the semiconductor substrate and a parasitic capacitance which occurs between the memory cell transistors adjacent in the direction of the word line.

To prevent such problems, there is proposed formation of a NAND-type flash memory on an SOI substrate (see, e.g., Japanese Patent Laid-Open No. 2000-174241 and Japanese Patent Laid-Open No. 11-163303).

However, since this method uses an SOI substrate as a substrate, it is higher in substrate cost than a case where an ordinary silicon substrate is used.

The following are the names of documents pertaining to a NAND-type flash memory formed on an SOI:
Japanese Patent Laid-Open No. 2000-174241 and
Japanese Patent Laid-Open No. 11-163303.

SUMMARY OF THE INVENTION

According to an aspect of the present invention, there is provided a NAND-type semiconductor storage device including a semiconductor substrate;

a semiconductor layer formed on the semiconductor substrate;

a buried insulating film selectively formed between the semiconductor substrate and the semiconductor layer in a memory transistor formation region;

diffusion layers formed on the semiconductor layer in the memory transistor formation region;

floating body regions between the diffusion layers;

a first insulating film formed on each of the floating body regions;

a floating gate electrode formed on the first insulating film;

a control electrode on a second insulating film formed on the floating gate electrode; and contact plugs connected to ones of the pairs of diffusion layers which are respectively located at ends of the memory transistor formation region, wherein the ones of the pairs of diffusion layers, which are located at the ends of the memory transistor formation region, are connected to the semiconductor substrate below the contact plugs.

According to an aspect of the present invention, there is provided a NAND-type semiconductor storage device manufacturing method, including forming a layer to be removed on a substrate, removing a part of the layer to be removed, forming a semiconductor layer on the layer to be removed, after the part of the layer to be removed is removed, forming a trench which extends through the semiconductor layer and reaches the layer to be removed, removing the layer to be removed using the trench, forming a buried insulating film in a cavity formed after the layer to be removed is removed, forming a first insulating film above a region where the buried insulating film is formed, forming a floating gate electrode on the first insulating film, forming a second insulating film on the floating gate electrode, forming a control electrode on the second insulating film, and forming a pair of diffusion layers in the semiconductor layer to have the floating gate electrode between the pair of diffusion layers.

DETAILED DESCRIPTION OF THE INVENTION

Embodiments of the present invention will be explained below with reference to the drawings.

(1) First Embodiment

Figure 1A:
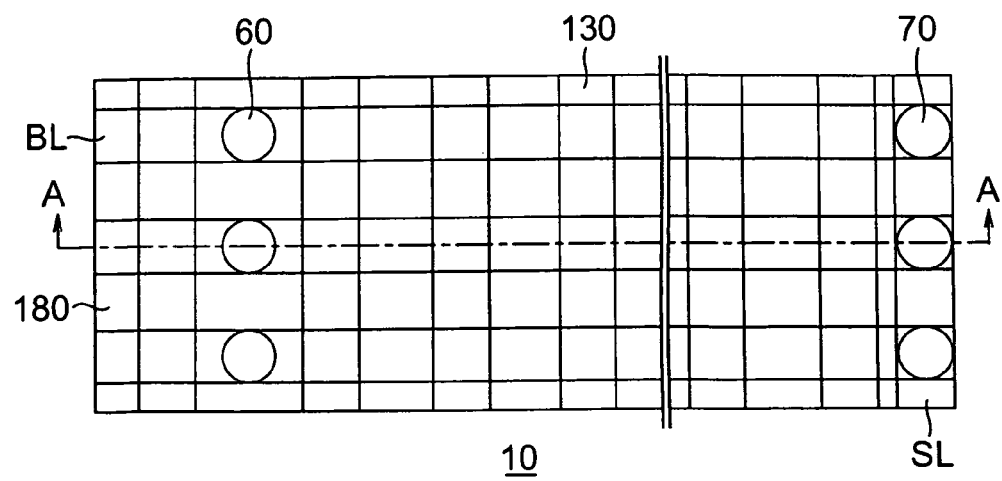
FIGS. 1(A) and 1(B) are a plan view and a sectional view, respectively, showing the configuration of a memory cell region of a NAND-type flash memory according to a first embodiment of the present invention.
Figure 1B:
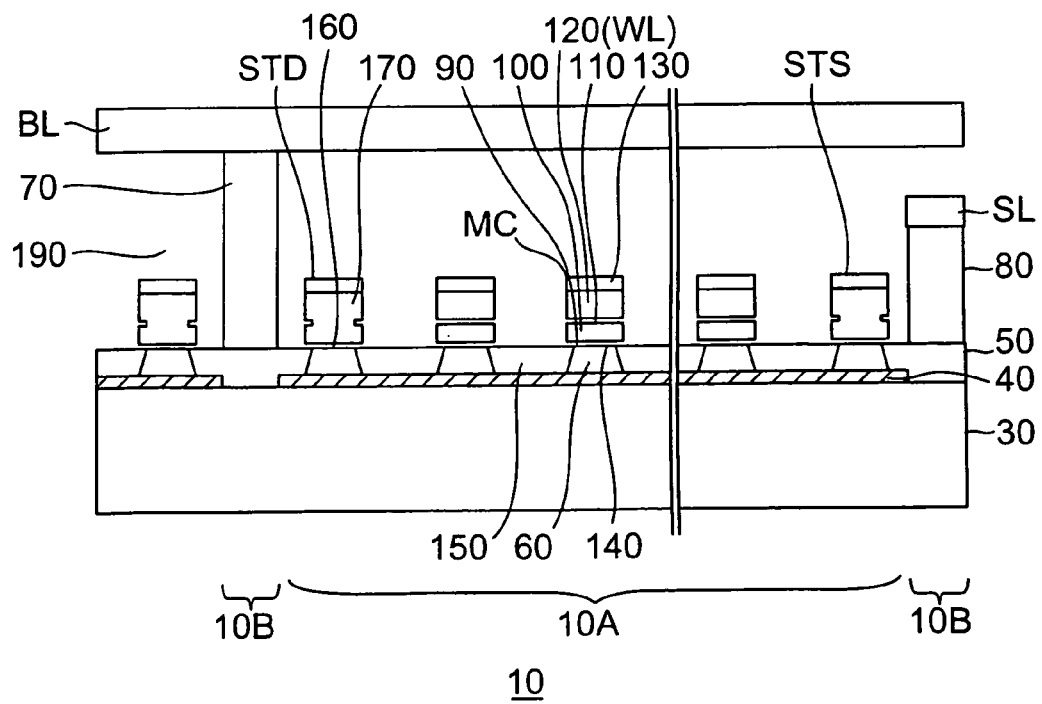
Figure 2A:
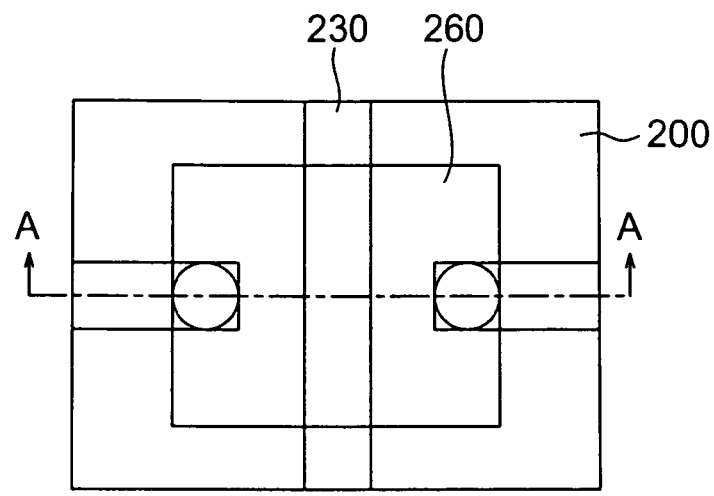
FIGS. 2(A) and 2(B) are a plan view and a sectional view, respectively, showing the configuration of a peripheral circuit region of the NAND-type flash memory according to the first embodiment of the present invention.
Figure 2B:
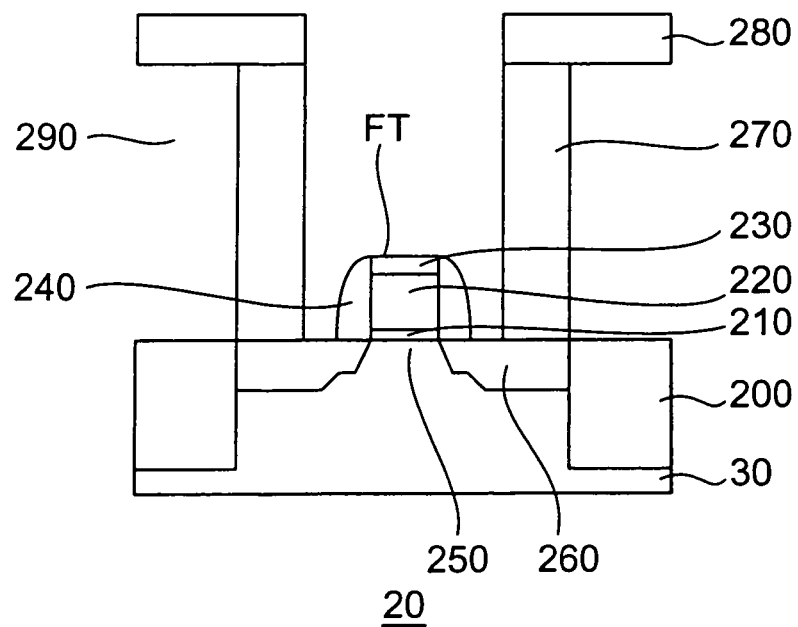
Figure 3A:
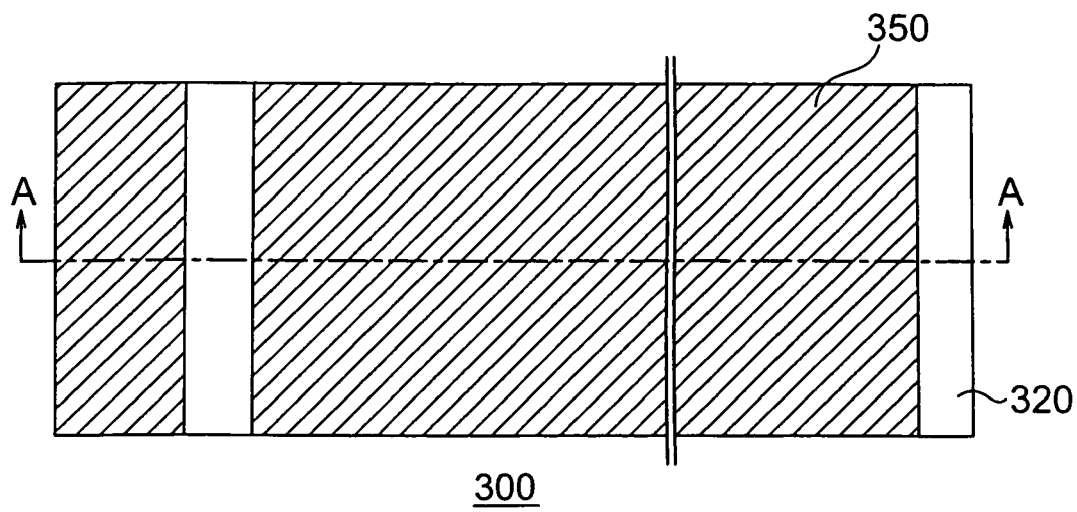
FIGS. 3(A) and 3(B) are a plan view and a longitudinal sectional view, respectively, of an element specific to a step of a manufacturing method for the NAND-type flash memory according to the first embodiment of the present invention.
Figure 3B:
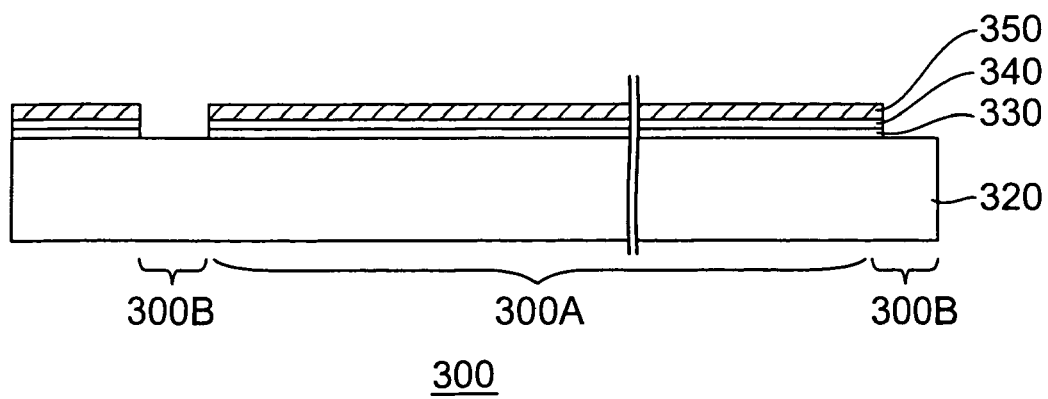
Figure 4A:
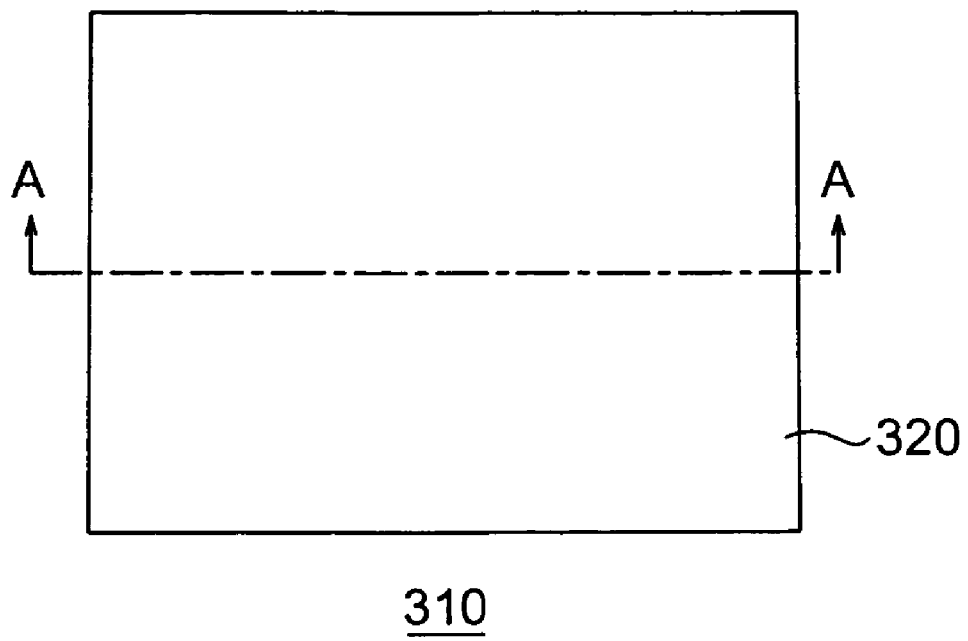
FIGS. 4(A) and 4(B) are a plan view and a longitudinal sectional view, respectively, of the element specific to another step of the manufacturing method for the NAND-type flash memory according to the first embodiment of the present invention.
Figure 4B:
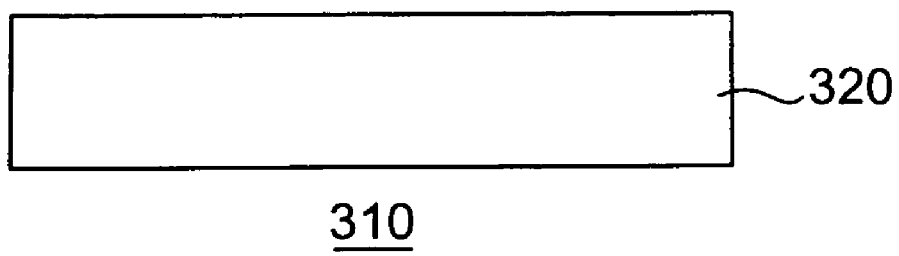
Figure 5A:
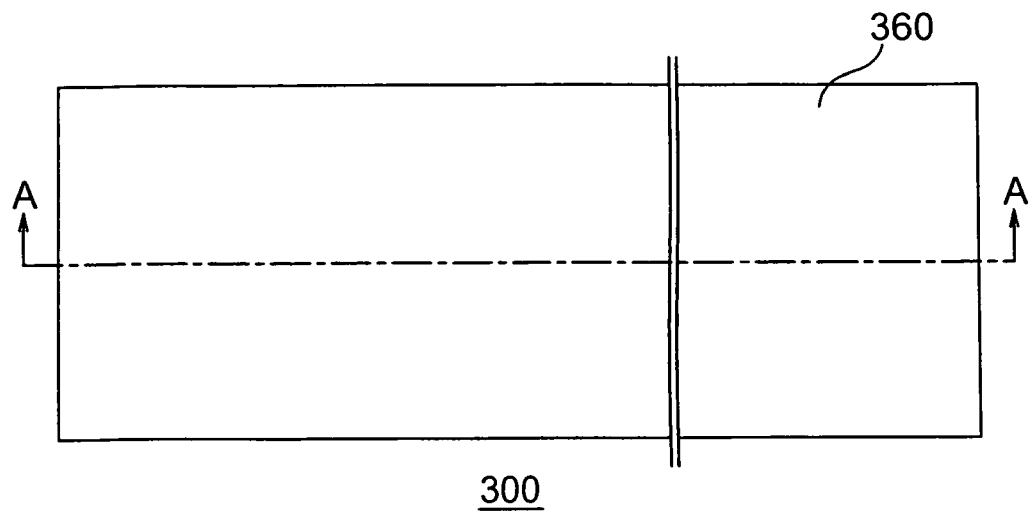
FIGS. 5(A) and 5(B) are a plan view and a longitudinal sectional view, respectively, of the element specific to still another step of the manufacturing method for the NAND-type flash memory according to the first embodiment of the present invention.
Figure 5B:
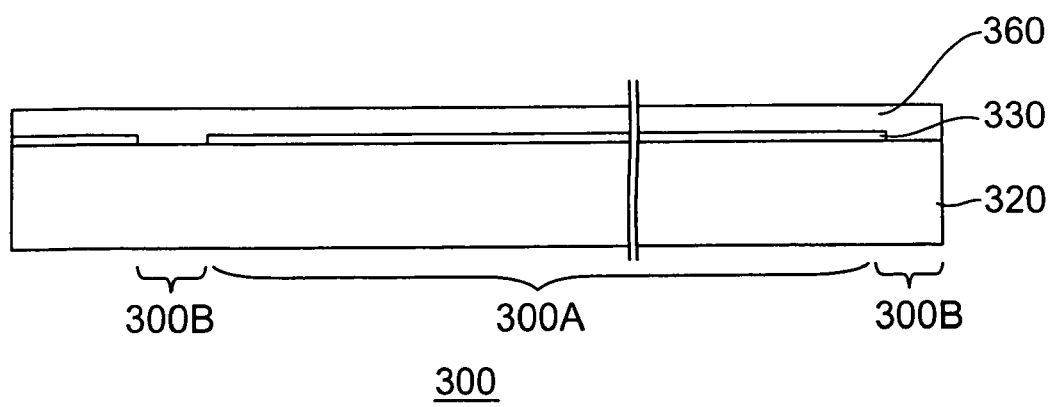
Figure 6A:
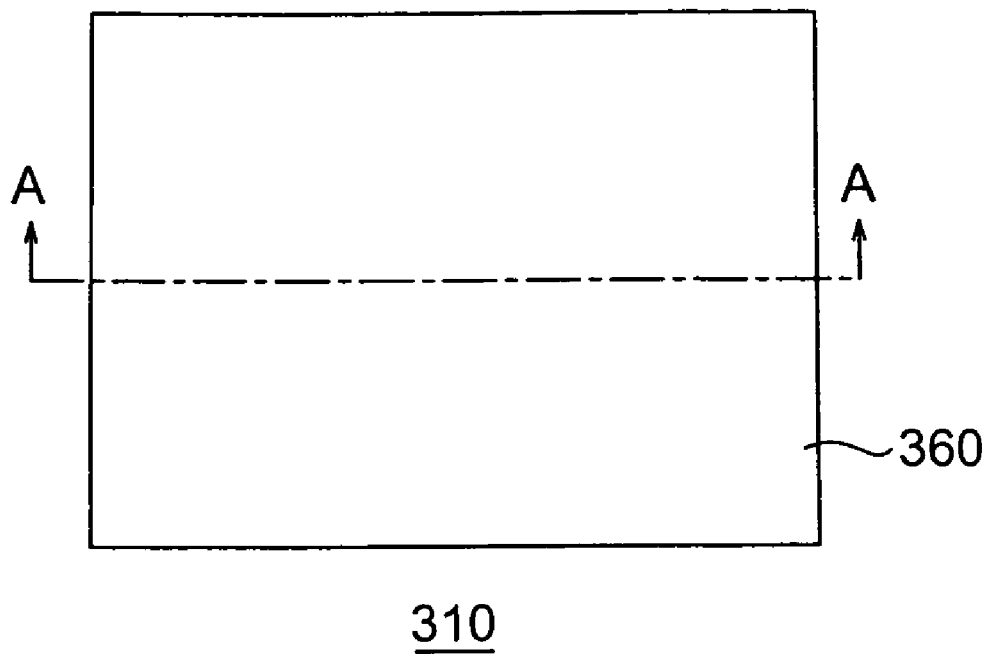
FIGS. 6(A) and 6(B) are a plan view and a longitudinal sectional view, respectively, of the element specific to still another step of the manufacturing method for the NAND-type flash memory according to the first embodiment of the present invention.
Figure 6B:
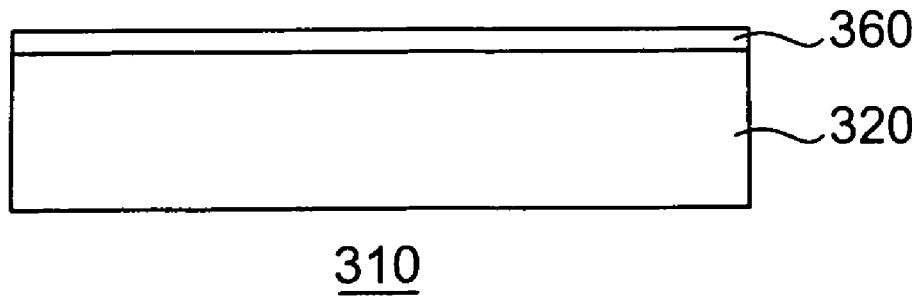

FIGS. 1(A) and 1(B) show the configuration of a part of a memory cell region 10 of a NAND-type flash memory according to a first embodiment of the present invention. FIGS. 2(A) and 2(B) show the configuration of a part of a peripheral circuit region 20 of the NAND-type flash memory.

FIG. 1(A) shows a plan view of the memory cell region 10 of the NAND-type flash memory as seen from above; and FIG. 1(B), a longitudinal sectional view of the memory cell region 10 taken along a line A-A. FIG. 2(A) shows a plan view of the peripheral circuit region 20 of the NAND-type flash memory as seen from above; and FIG. 2(B), a longitudinal sectional view of the peripheral circuit region 20 taken along a line A-A.

As shown in FIGS. 1(A) and 1(B), in the memory cell region 10 of the NAND-type flash memory, a buried insulating film 40 is selectively formed in a memory transistor formation region 10A where memory cell transistors MC and selection transistors STD and STS are formed, on a P-type semiconductor substrate 30.

A P-type semiconductor layer 50 is formed to be arranged above the semiconductor substrate 30 via the buried insulating film 40 in the memory transistor formation region 10A and be arranged on the semiconductor substrate 30 in contact plug formation regions 10B where a bit line contact plug 70 and a source line contact plug 80 are formed.

In each memory cell transistor MC, a P-type floating body 60 which is electrically floating is formed in the semiconductor layer 50 formed above the semiconductor substrate 30 via the buried insulating film 40.

The memory cell transistor MC has a structure in which a floating gate electrode 100 formed above the floating body 60 via a tunnel insulating film 90 and a control gate electrode (control electrode) 120 formed above the floating gate electrode 100 via an interelectrode insulating film 110 are stacked. Note that a silicide 130 is formed on the control gate electrode 120.

In the memory cell transistor MC, a channel region 140 is formed on a surface portion of the floating body 60, and a pair 150 of N-type source and drain regions (diffusion layer) is formed on two sides of the floating body 60.

Note that in each of the selection transistors STD and STS, a gate electrode 170 is formed above the floating body 60 via a gate insulating film 160. The gate electrode 170 is formed by short-circuiting the floating gate electrode 100 and control gate electrode 120.

In each contact plug formation region 10B of the semiconductor layer 50, the pair 150 of N-type source and drain regions is formed to be connected to the semiconductor substrate 30. The pair 150 of N-type source and drain regions formed in the contact plug formation region 10B and the P-type semiconductor substrate 30 are isolated from each other by a PN junction.

The memory cell region 10 of the NAND-type flash memory is formed by series-connecting the pairs 150 of source and drain regions of the plurality of memory cell transistors MC between the two selection transistors STD and STS and connecting one of the selection transistors, the selection transistor STD to a bit line BL via the bit line contact plug 70 and the other, the selection transistor STS to a source line SL via the source line contact plug 80. The control gate electrode 120 of each memory cell transistor MC serves as a part of a word line WL.

An element isolation insulating film (element isolation region) 180 is formed between ones of the memory cell transistors MC which are adjacent to each other in the direction of the corresponding word line WL. The memory cell transistors MC adjacent to each other in the direction of the word line WL are isolated from each other by the element isolation insulating film 180. An interlayer insulating film 190 is formed between the bit line BL and the semiconductor layer 50.

As shown in FIGS. 2(A) and 2(B), for example, a transfer transistor FT connected to the word line WL to supply a predetermined potential to the control gate electrode 120 of the memory cell transistor MC is formed in the peripheral circuit region 20 of the NAND-type flash memory.

In the transfer transistor FT, an element isolation insulating film 200 is formed on each of surface portions of the semiconductor substrate 30, and a gate electrode 220 is formed near the center of an element region of the semiconductor substrate 30 which is isolated by the element isolation insulating films 200 via a gate insulating film 210.

A silicide 230 is formed on a surface of the gate electrode 220, and gate electrode sidewalls 240 are formed on side surfaces of the gate electrode 220. A channel region 250 is formed below the gate electrode 220 and near a surface of the semiconductor substrate 30. A pair 260 of source and drain regions is formed on two sides of the channel region 250.

A contact plug 270 is formed on each of upper surfaces of the pair 260 of source and drain regions, and a piece 280 of wiring is connected to each contact plug 270. An interlayer insulating film 290 is formed between the pieces 280 of wiring and the semiconductor substrate 30.

A manufacturing method for a NAND-type flash memory according to this embodiment will be explained with reference to FIGS. 3(A) to 12(B).

Note that FIGS. 3(A), 5(A), 7(A), 9(A), and 11(A) show plan views of a memory cell region 300 in an element as seen from above, specific to respective steps of the manufacturing method and that FIGS. 3(B), 5(B), 7(B), 9(B), and 11(B) show longitudinal sectional views of the memory cell region 300 in the element taken along lines A-A, specific to the respective steps.

FIGS. 4(A), 6(A), 8(A), 10(A), and 12(A) show plan views of a peripheral circuit region 310 in the element as seen from above, specific to the respective steps, and FIGS. 4(B), 6(B), 8(B), 10(B), and 12(B) show longitudinal sectional views of the peripheral circuit region 310 taken along lines A-A.

As shown in FIGS. 3(A) and 3(B) and FIGS. 4(A) and 4(B), a silicon germanium (SiGe) layer 330 with a germanium (Ge) concentration of, e.g., 30% is formed as a layer to be removed all over a semiconductor substrate 320 to a thickness of, e.g., about 25 nm by epitaxial growth technique.

A silicon (Si) layer 340 is formed all over the silicon germanium layer 330 to a thickness of about 20 nm by epitaxial growth technique, and then, a silicon nitride (SiN) film 350 is formed all over the silicon layer 340.

The silicon nitride film 350 is patterned by lithography and RIE. With this operation, in the memory cell region 300, a part of the silicon nitride film 350 which is formed in a contact plug formation region 300B is removed, and in the peripheral circuit region 310, a part of the silicon nitride film 350 which is formed therein is removed. The silicon layer 340 and silicon germanium layer 330 are sequentially etched using the silicon nitride film 350 as a mask, thereby exposing a surface of the semiconductor substrate 320.

As shown in FIGS. 5(A) and 5(B) and FIGS. 6(A) and 6(B), after the silicon nitride film 350 is removed, a silicon layer 360 is formed all over the semiconductor substrate 320 and silicon germanium layer 330 to, e.g., a thickness of 30 nm by epitaxial growth technique. Note that at this time, the silicon germanium layer 330 is used as a seed in a memory transistor formation region 300A of the memory cell region 300 and that the semiconductor substrate 320 is used as a seed in each of the contact plug formation region 300B and peripheral circuit region 310 of the memory cell region 300.

Figure 7A:
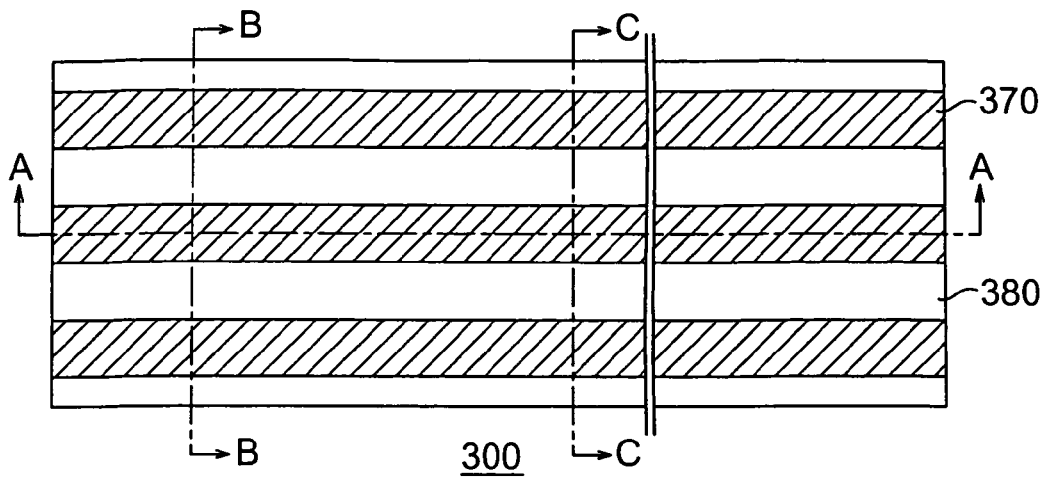
FIGS. 7(A) to 7(D) are a plan view and a longitudinal sectional view, respectively, of the element specific to still another step of the manufacturing method for the NAND-type flash memory according to the first embodiment of the present invention.
Figure 7B:
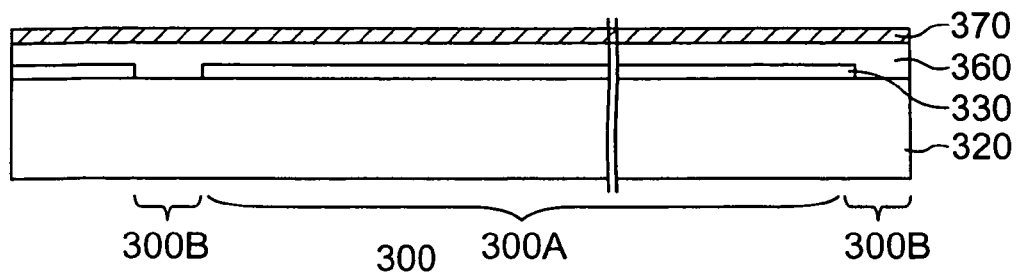
Figure 7C:
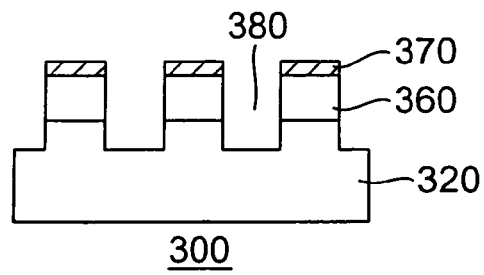
Figure 7D:
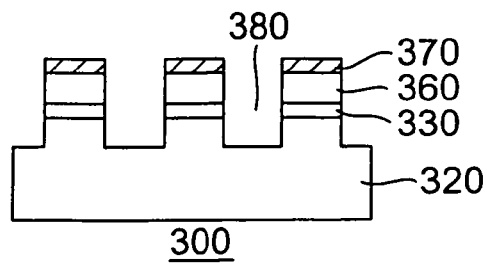
Figure 8A:
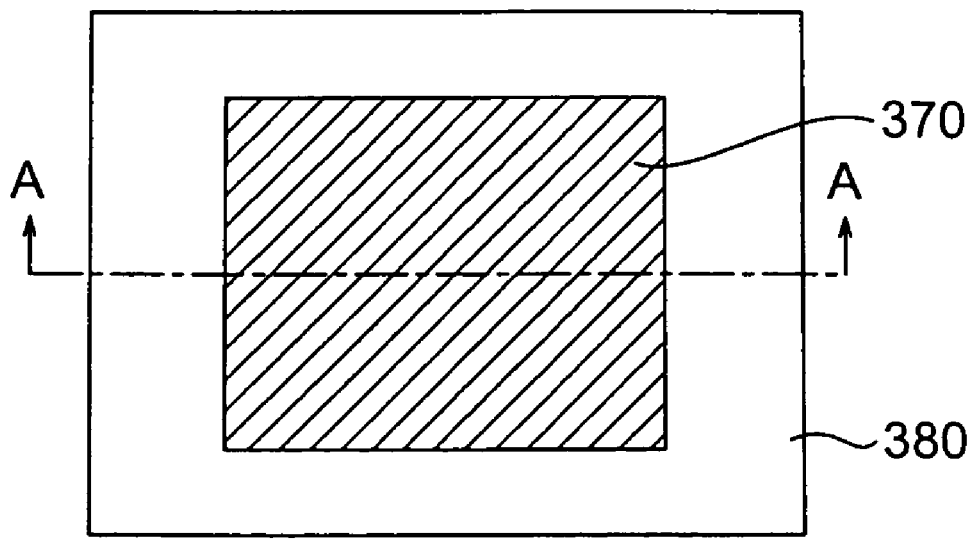
FIGS. 8(A) and 8(B) are a plan view and a longitudinal sectional view, respectively, of the element specific to still another step of the manufacturing method for the NAND-type flash memory according to the first embodiment of the present invention.
Figure 8B:
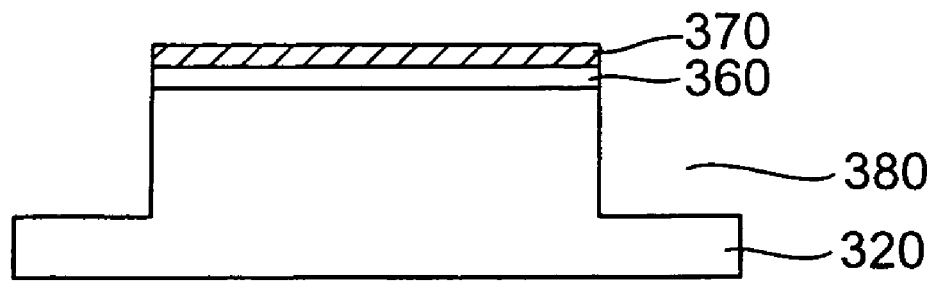
Figure 9A:
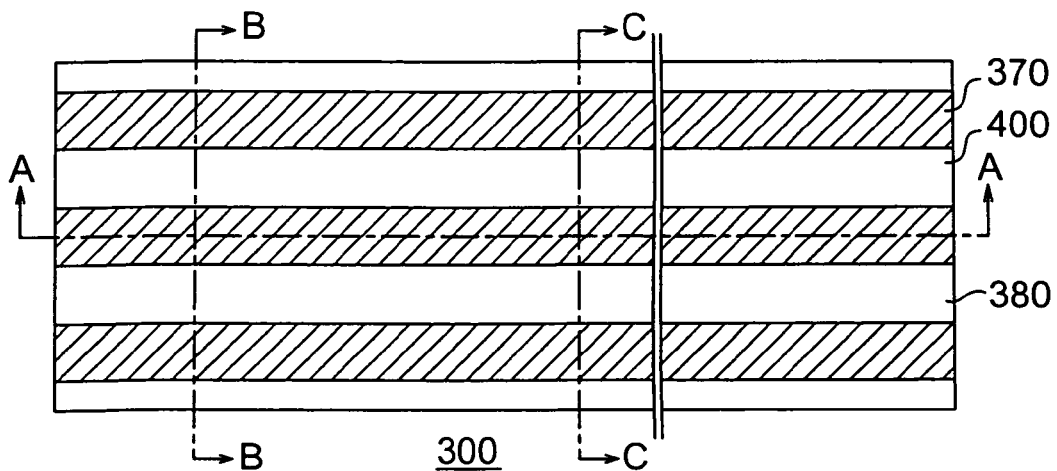
FIGS. 9(A) to 9(D) are a plan view and a longitudinal sectional view, respectively, of the element specific to still another step of the manufacturing method for the NAND-type flash memory according to the first embodiment of the present invention.
Figure 9B:
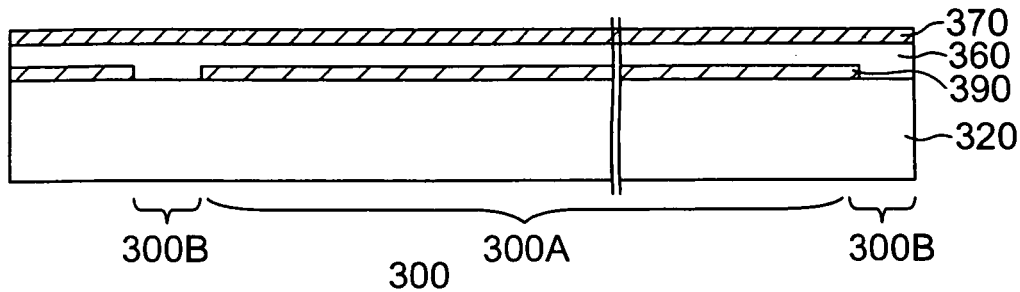
Figure 9C:
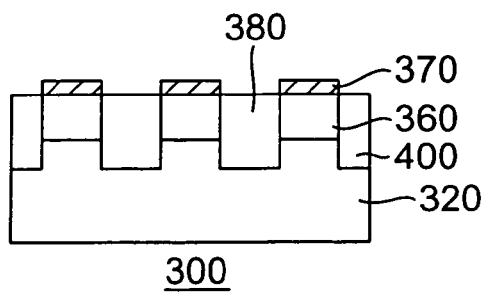
Figure 9D:
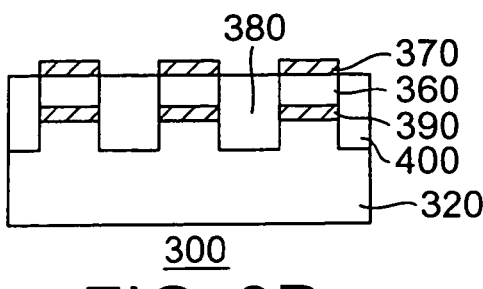
Figure 10A:
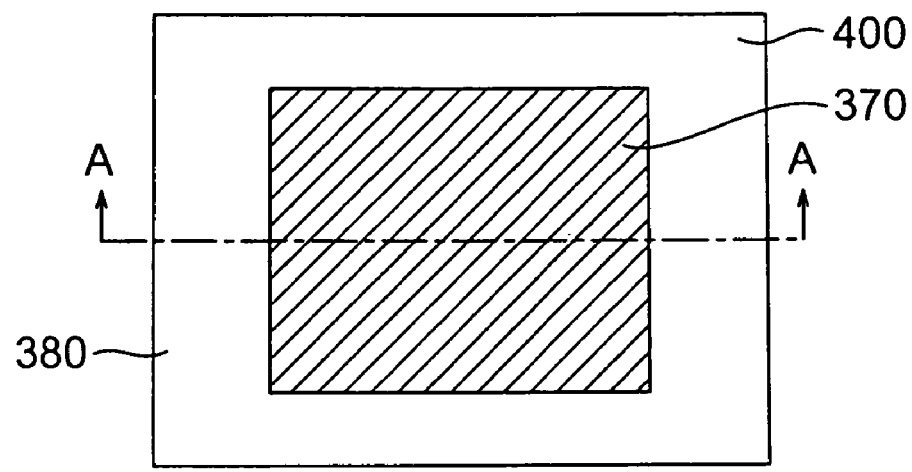
FIGS. 10(A) and 10(B) are a plan view and a longitudinal sectional view, respectively, of the element specific to still another step of the manufacturing method for the NAND-type flash memory according to the first embodiment of the present invention.
Figure 10B:
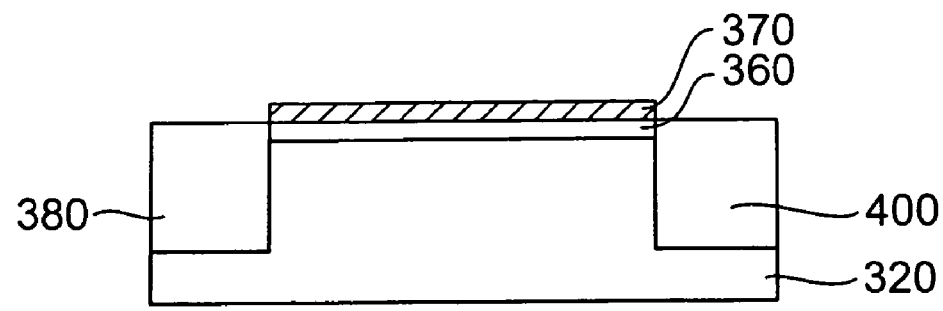
Figure 11A:
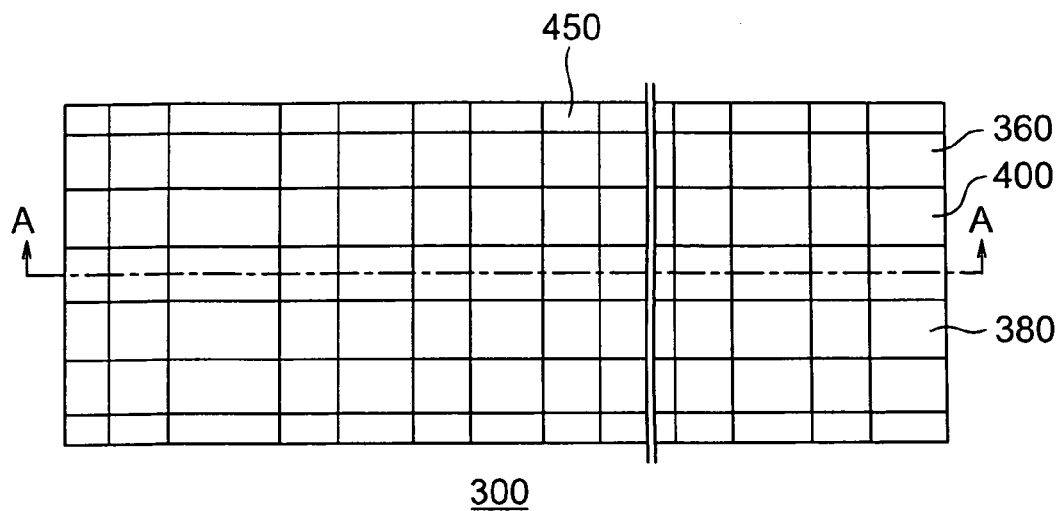
FIGS. 11(A) and 11(B) are a plan view and a longitudinal sectional view, respectively, of the element specific to still another step of the manufacturing method for the NAND-type flash memory according to the first embodiment of the present invention.
Figure 11B:
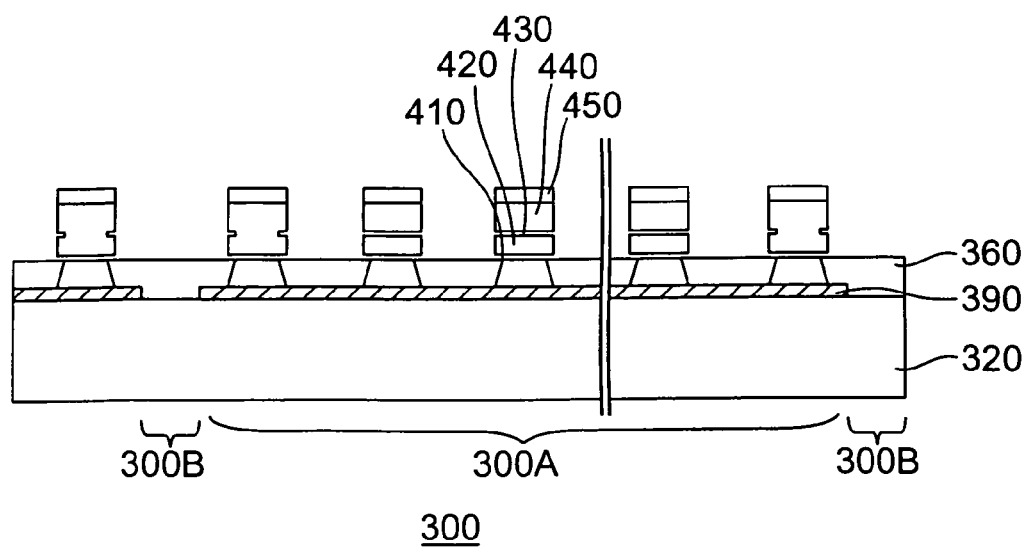
Figure 12A:
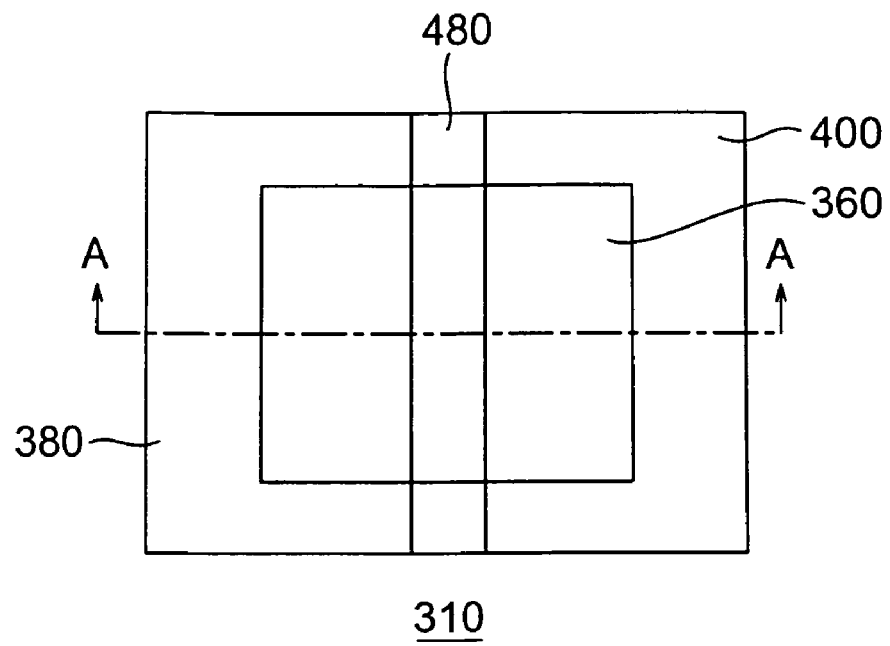
FIGS. 12(A) and 12(B) are a plan view and a longitudinal sectional view, respectively, of the element specific to still another step of the manufacturing method for the NAND-type flash memory according to the first embodiment of the present invention.
Figure 12B:
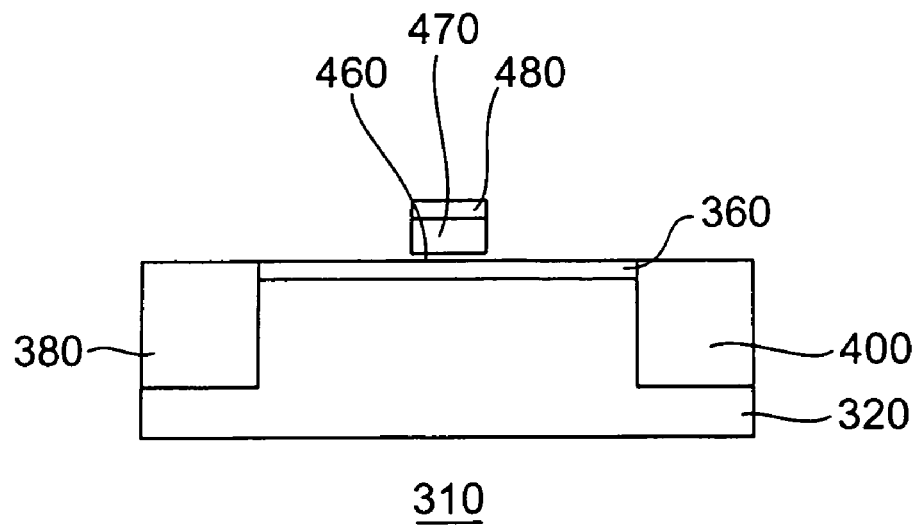

As shown in FIGS. 7(A) to 7(D) and FIGS. 8(A) and 8(B), a mask material 370 composed of, e.g., a silicon nitride film is deposited all over the silicon layer 360 and then patterned by lithography and RIE. Note that FIG. 7(C) shows a longitudinal sectional view of the memory cell region 300 taken along a line B-B and that FIG. 7(D) shows a longitudinal sectional view of the memory cell region 300 taken along a line C-C.

The silicon layer 360, silicon germanium layer 330, and semiconductor substrate 320 are sequentially etched using the mask material 370 as a mask, thereby forming element isolation trenches 380. At this time, in the memory transistor formation region 300A of the memory cell region 300, side surfaces of the silicon germanium layer 330 are exposed at an inner surface of each element isolation trench 380 (FIG. 7(D)).

As shown in FIGS. 9(A) to 9(D) and FIGS. 10(A) and 10(B), the semiconductor substrate 30 is immersed in a predetermined etching solution. The silicon germanium layer 330 exposed at the inner surfaces of the element isolation trenches 380 is etched by wet etching and removed. Note that the etching solution to be used here is a mixed solution obtained by mixing an aqueous nitric acid solution of 70%, an aqueous hydrofluoric acid solution of 49%, an aqueous acetic acid solution of 99.9%, and water at a volume ratio of 40:1:257.

With this operation, cavities (not shown) are formed in regions from which the formed silicon germanium layer 330 has been removed. In this case, a part of the silicon layer 360 which is formed in each contact plug formation region 300B serves as a support unit which supports a part of the silicon layer 360 which is formed in the memory transistor formation region 300A.

The entire surface of the semiconductor substrate 320 is oxidized. With this operation, the cavities (not shown) are filled with buried insulating films 390, each composed of, e.g., a silicon oxide ($SiO_2$) film, and a silicon oxide film (not shown) is formed on the inner surface of each element isolation trench 380 to a thickness of about 13 nm. As described above, an SOI structure is selectively formed in the memory transistor formation region 300A of the memory cell region 300.

Each element isolation trench 380 is filled with, e.g., a silicon oxide film by CVD, and the silicon oxide film is planarized, thereby forming an element isolation insulating film 400. Note that if the element isolation insulating films 400 are formed by filling the element isolation trenches 380 with silicon oxide films by CVD without oxidation, the buried insulating films 390 may be formed by filling the cavities (not shown) with the silicon oxide films.

As shown in FIGS. 11(A) and 11(B) and FIGS. 12(A) and 12(B), the mask material 370 is removed. In the memory cell region 300, a floating gate electrode 420 is formed above the silicon layer 360 via a tunnel insulating film 410, and a control gate electrode 440 is formed above the floating gate electrode 420 via an interelectrode insulating film 430. After that, a silicide 450 is formed on the control gate electrode 440. In the peripheral circuit region 310, after a gate electrode 470 is formed above the silicon layer 360 via a gate insulating film 460, a silicide 480 is formed on the gate electrode 470.

After that, although not shown, pairs of source and drain regions are formed by ion implantation, and an interlayer insulating film is formed all over the silicon layer 360 by CVD. A source line contact plug and a source line are formed, and a bit line contact plug and a bit line are formed in sequence. In this manner, the NAND-type flash memory shown in FIGS. 1(A), 1(B), 2(A), and 2(B) is manufactured.

As described above, according to this embodiment, an SOI structure can be selectively formed in the memory cell region 10 of the ordinary semiconductor substrate 30 without using an SOI substrate. This makes it possible to improve memory cell characteristics while keeping production costs low.

More specifically, isolation of a piece of wiring such as the bit line BL and the semiconductor substrate 30 from each other by the buried insulating film 40 makes it possible to make a parasitic resistance generated between the piece of wiring and the semiconductor substrate 30 lower than a case where a NAND-type flash memory is formed on an ordinary semiconductor substrate without forming an SOI structure. Accordingly, variations in gate threshold voltage can be reduced.

Complete isolation of ones of the memory cell transistors MC which are adjacent to each other in the direction of the corresponding word line from each other by the buried insulating film 40 makes it possible to make a parasitic capacitance which occurs between the memory cell transistors MC adjacent in the direction of the word line smaller than a case where a NAND-type flash memory is formed on an ordinary semiconductor substrate without forming an SOI structure. Accordingly, variations in gate threshold voltage can be reduced. In this case, occurrence of punch-through between the memory cell transistors MC adjacent in the direction of the word line can be inhibited. It is further possible to inhibit a parasitic MOS transistor using the element isolation insulating film 180 as a gate insulating film from being formed in a region where each control gate electrode 120 as a part of the word line WL and the element isolation insulating film 180 meet and increase a field inversion voltage.

Selective formation of an SOI structure in the memory cell region 10 of the ordinary semiconductor substrate 30 eliminates the need to significantly change a design environment, unlike a case where a NAND-type flash memory is formed on an SOI substrate. Accordingly, development efficiency can be improved correspondingly. In this case, it is possible to ensure continuity with the specification of a conventional NAND-type flash memory formed on the semiconductor substrate.

Since the transfer transistor FT formed in the peripheral circuit region 20 performs data erase and write operations for the memory cell transistor MC, a high voltage is applied to the transfer transistor FT. Accordingly, if an SOI structure is formed in the peripheral circuit region 20, so-called floating body effects occur due to an applied high voltage, and punch-through becomes more likely to occur.

If no SOI structure is formed in the peripheral circuit region 20 like this embodiment, punch-through can be suppressed, and the transistor characteristics of the transfer transistor FT formed in the peripheral circuit region 20 can be improved. In this case, even if a high electrostatic voltage is applied to the transfer transistor FT, no holes are accumulated in each floating body, like a case where an SOI structure is formed. Accordingly, occurrence of electrostatic discharge (ESD) can be inhibited correspondingly.

(2) Second Embodiment

Figure 13:
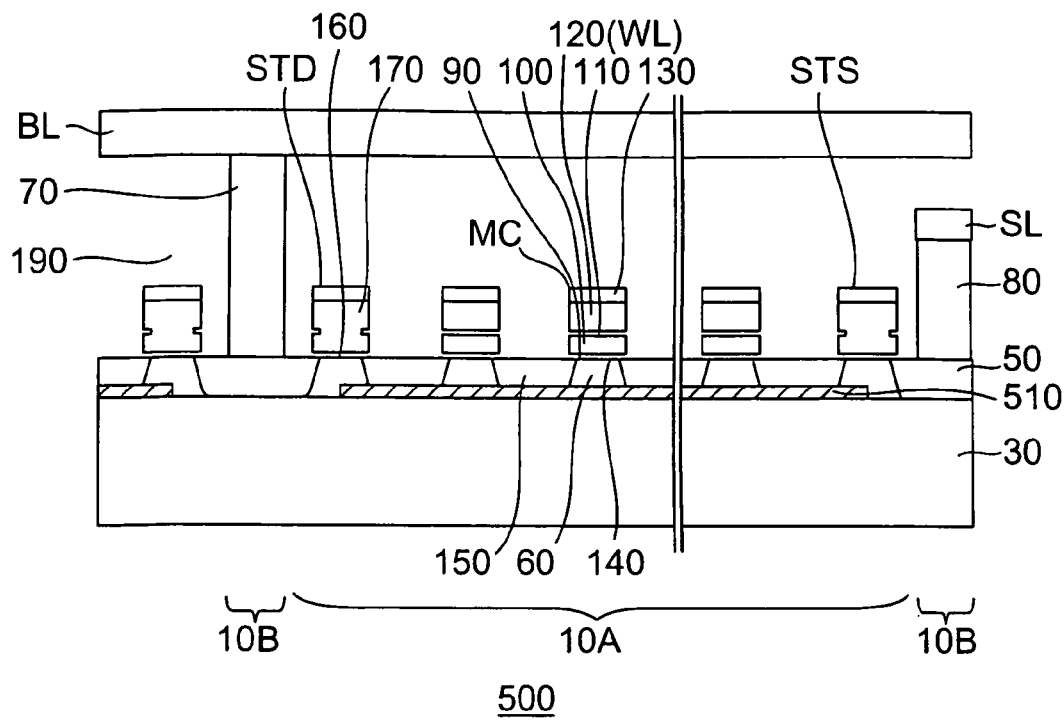
FIG. 13 is a sectional view showing the configuration of a memory cell region of a NAND-type flash memory according to a second embodiment of the present invention.

FIG. 13 shows the configuration of a part of a memory cell region 500 of a NAND-type flash memory according to a second embodiment of the present invention. Note that the same reference numerals denote the same components as those shown in FIGS. 1(A) and 1(B) and that an explanation thereof will be omitted.

In this embodiment, a buried insulating film 510 is selectively formed in a memory transistor formation region 10A except a part of a region where a floating body 60 of a selection transistor STD is formed and a part of a region where the floating body 60 of a selection transistor STS is formed.

With this configuration, not only a pair 150 of source and drain regions formed in each of contact plug formation regions 10B of a semiconductor layer 50 but also a part of the floating body 60 of the selection transistor STD and a part of that of the selection transistor STS are formed to be connected to a semiconductor substrate 30.

As described above, according to this embodiment, a back-gate bias can be applied to each of the selection transistors STD and STS by applying a predetermined voltage to the semiconductor substrate 30. This makes it possible to improve the cutoff characteristics of the selection transistors STD and STS.

Since the area of a part of a bottom surface of the semiconductor layer 50 which is in contact with the semiconductor substrate 30 increases, the mechanical strength of the semiconductor layer 50 when removing a silicon germanium layer by wet etching (FIGS. 9(A) to 9(D)) can be increased. This makes it possible to inhibit collapse of the semiconductor layer 50 arranged above cavities formed by removing the silicon germanium layer and generation of dust. Accordingly, yields can be increased.

According to this embodiment, the same effects as those of the first embodiment can be obtained. More specifically, an SOI structure can be selectively formed in the memory cell region 500 of the ordinary semiconductor substrate 30 without using an SOI substrate. This makes it possible to improve memory cell characteristics while keeping production costs low.

(3) Third Embodiment

Figure 14:
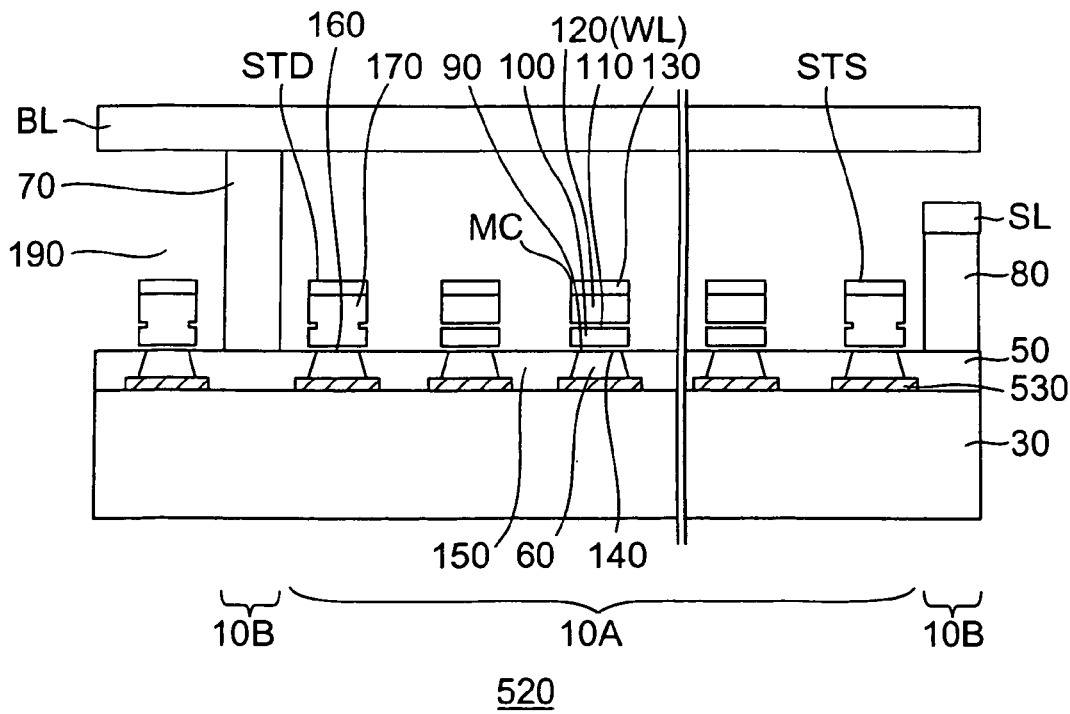
FIG. 14 is a sectional view showing the configuration of a memory cell region of a NAND-type flash memory according to a third embodiment of the present invention.

FIG. 14 shows the configuration of a part of a memory cell region 520 of a NAND-type flash memory according to a third embodiment of the present invention. Note that the same reference numerals denote the same components as those shown in FIGS. 1(A) and 1(B) and that an explanation thereof will be omitted.

In this embodiment, a buried insulating film 530 is selectively formed in a region of a memory transistor formation region 10A where a floating body 60 is formed such that the buried insulating film 530 corresponds to the floating body 60. With this configuration, pairs 150 of source and drain regions formed in a semiconductor layer 50 are all formed to be connected to a semiconductor substrate 30.

As described above, according to this embodiment, the area of a part of a bottom surface of the semiconductor layer 50 which is in contact with the semiconductor substrate 30 becomes larger than that in the second embodiment. Thus, the mechanical strength of the semiconductor layer 50 when removing a silicon germanium layer by wet etching (FIGS. 9(A) to 9(D)) can be further increased. This makes it possible to inhibit collapse of the semiconductor layer 50 arranged above cavities formed by removing the silicon germanium layer and generation of dust. Accordingly, yields can be increased.

According to this embodiment, the same effects as those of the first embodiment can be obtained. More specifically, an SOI structure can be selectively formed in the memory cell region 520 of the ordinary semiconductor substrate 30 without using an SOI substrate. This makes it possible to improve memory cell characteristics while keeping production costs low.

(4) Fourth Embodiment

Figure 15:
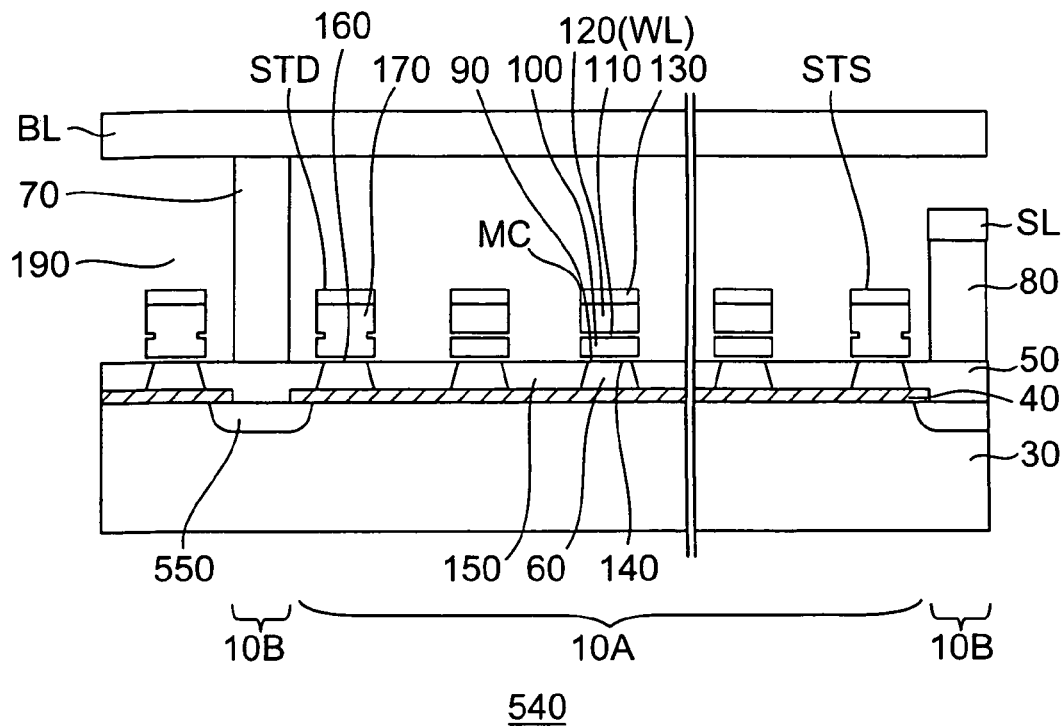
FIG. 15 is a sectional view showing the configuration of a memory cell region of a NAND-type flash memory according to a fourth embodiment of the present invention.

FIG. 15 shows the configuration of a part of a memory cell region 540 of a NAND-type flash memory according to a fourth embodiment of the present invention. Note that the same reference numerals denote the same components as those shown in FIGS. 1(A) and 1(B) and that an explanation thereof will be omitted.

In this embodiment, a pair 550 of N-type source and drain regions is selectively formed on a surface portion of a semiconductor substrate 30 such that the pair 550 of N-type source and drain regions is in contact with a pair 150 of source and drain regions formed in each of contact plug formation regions 10B of a semiconductor layer 50.

Each contact plug formation region 10B of the semiconductor layer 50 is formed by epitaxially growing the semiconductor substrate 30. Accordingly, in the contact plug formation region 10B, a lattice mismatch (crystal misalignment) or crystal defect may occur at an interface between the semiconductor layer 50 and the semiconductor substrate 30. If a depletion layer is formed at the interface between the semiconductor layer 50 and the semiconductor substrate 30 due to occurrence of a lattice mismatch or crystal defect, a leak current disadvantageously occurs between the semiconductor layer 50 and the semiconductor substrate 30.

In contrast, according to this embodiment, each of the interfaces between the semiconductor layer 50 and the semiconductor substrate 30 in the contact plug formation region 10B is covered with the pair 550 of source and drain regions, and thus no depletion layer is formed at the interface. This makes it possible to inhibit occurrence of a leak current between the semiconductor layer 50 and the semiconductor substrate 30 in each contact plug formation region 10B.

According to this embodiment, the same effects as those of the first embodiment can be obtained. More specifically, an SOI structure can be selectively formed in the memory cell region 540 of the ordinary semiconductor substrate 30 without using an SOI substrate. This makes it possible to improve memory cell characteristics while keeping production costs low.

(5) Fifth Embodiment

Figure 16:
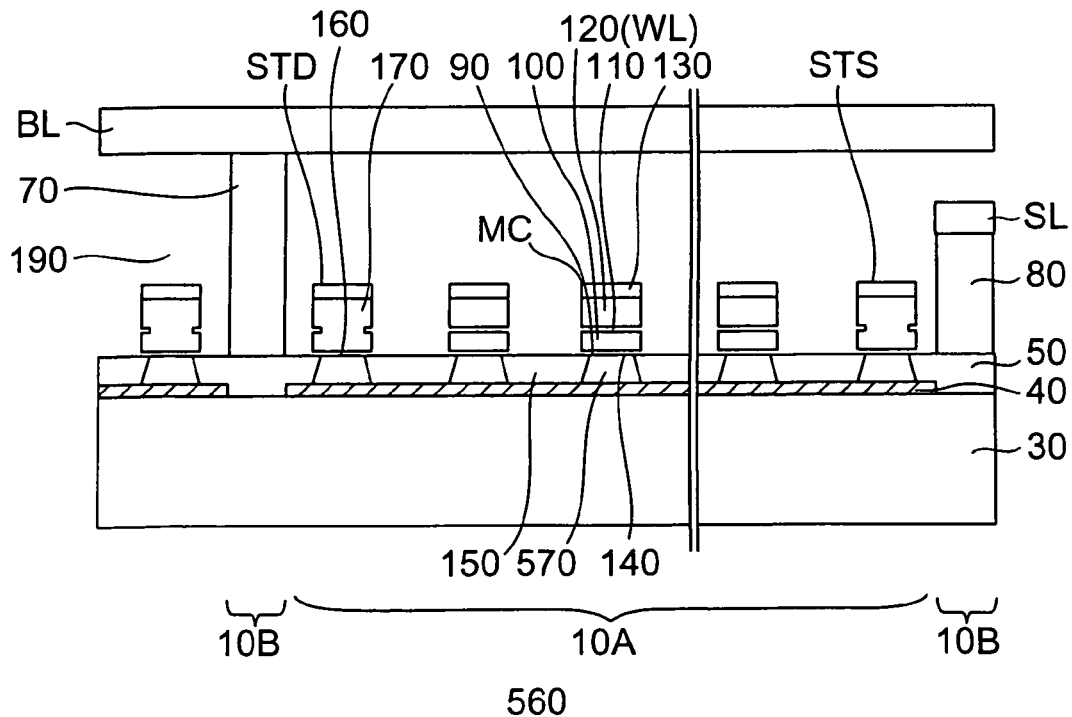
FIG. 16 is a sectional view showing the configuration of a memory cell region of a NAND-type flash memory according to a fifth embodiment of the present invention.
Figure 17A:
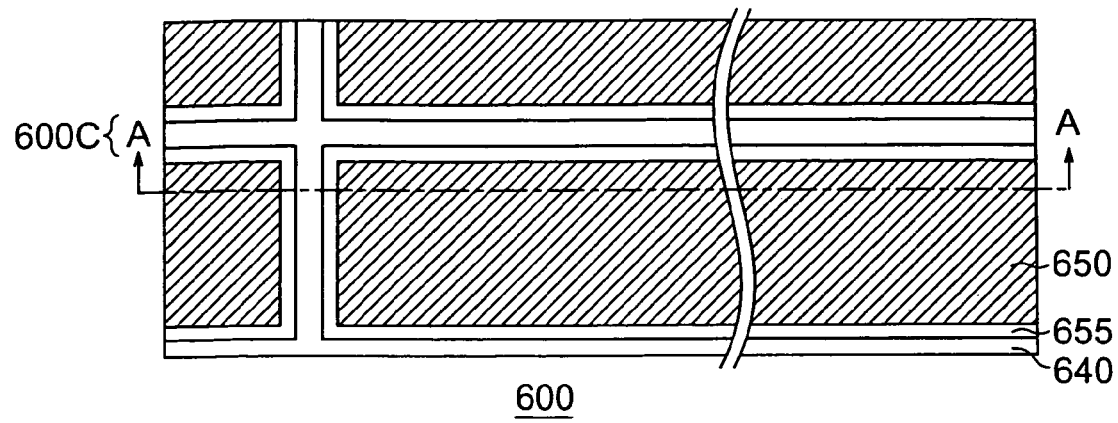
FIGS. 17(A) and 17(B) are a plan view and a longitudinal sectional view, respectively, of an element specific to a step of a manufacturing method for a NAND-type flash memory according to another embodiment of the present invention.
Figure 17B:
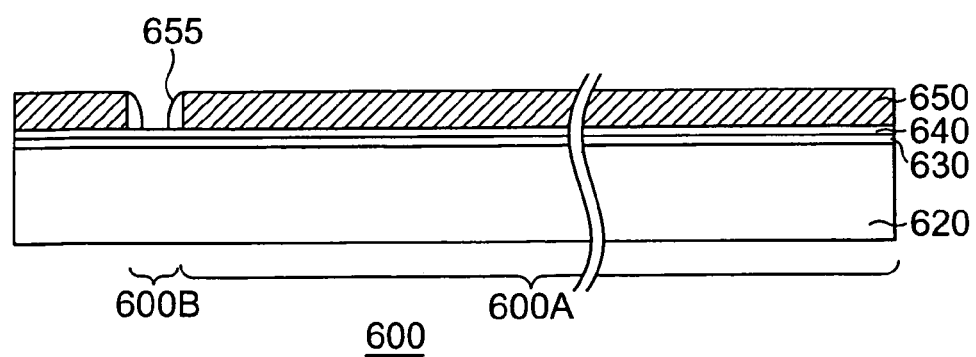
Figure 18A:
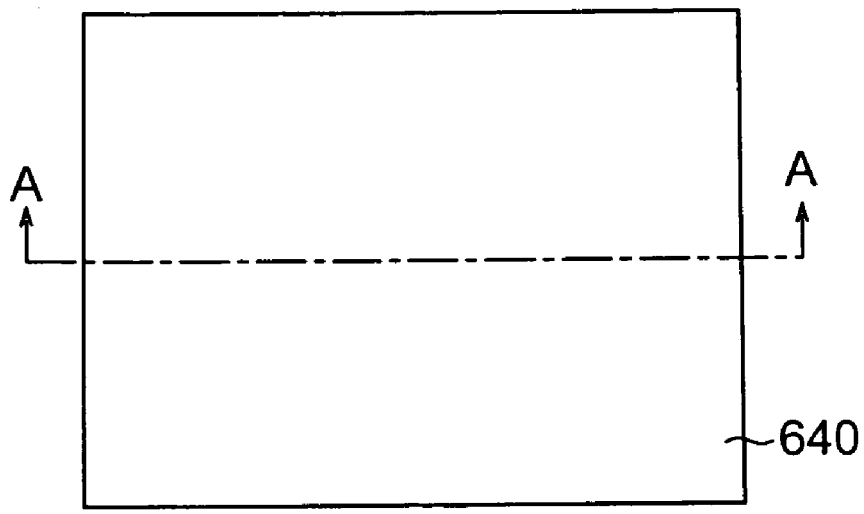
FIGS. 18(A) and 18(B) are a plan view and a longitudinal sectional view, respectively, of the element specific to the step of the manufacturing method for the NAND-type flash memory according to the embodiment of the present invention.
Figure 18B:
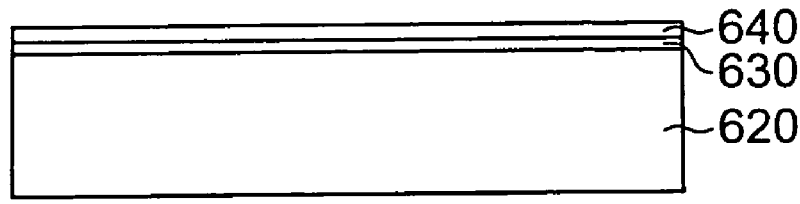
Figure 19A:
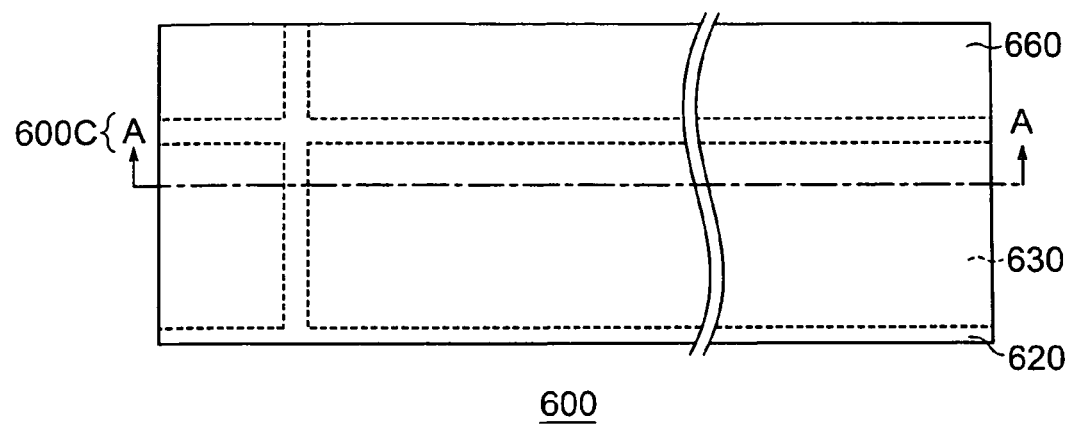
FIGS. 19(A) and 19(B) are a plan view and a longitudinal sectional view, respectively, of the element specific to another step of the manufacturing method for the NAND-type flash memory according to the embodiment of the present invention.
Figure 19B:
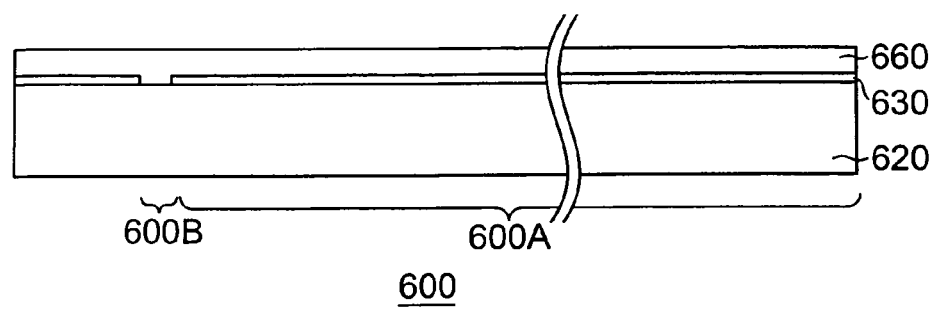
Figure 20A:
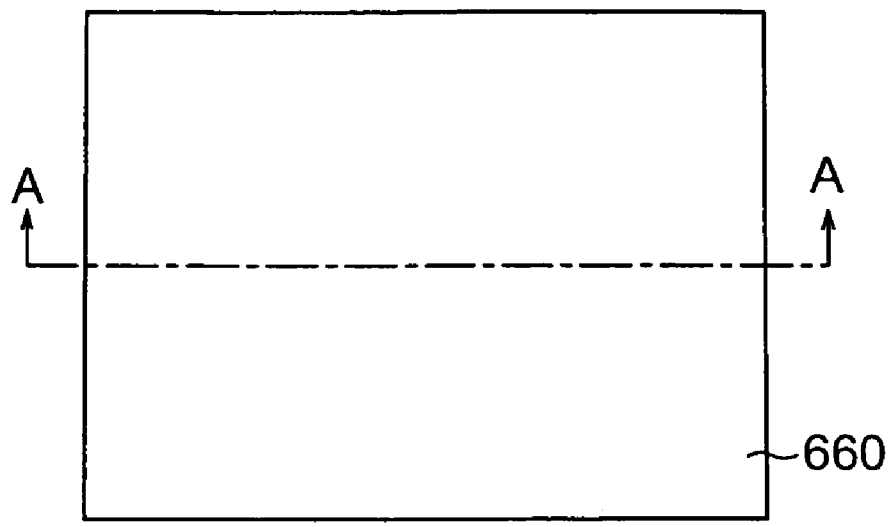
FIGS. 20(A) and 20(B) are a plan view and a longitudinal sectional view, respectively, of the element specific to the step of the manufacturing method for the NAND-type flash memory according to the embodiment of the present invention.
Figure 20B:
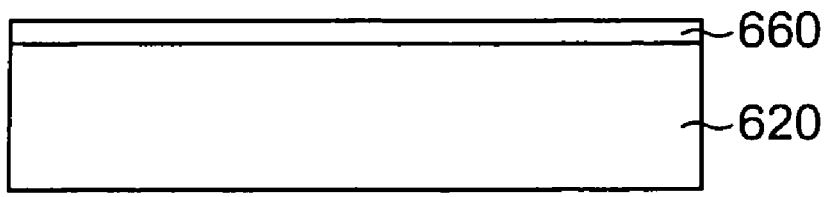
Figure 21A:
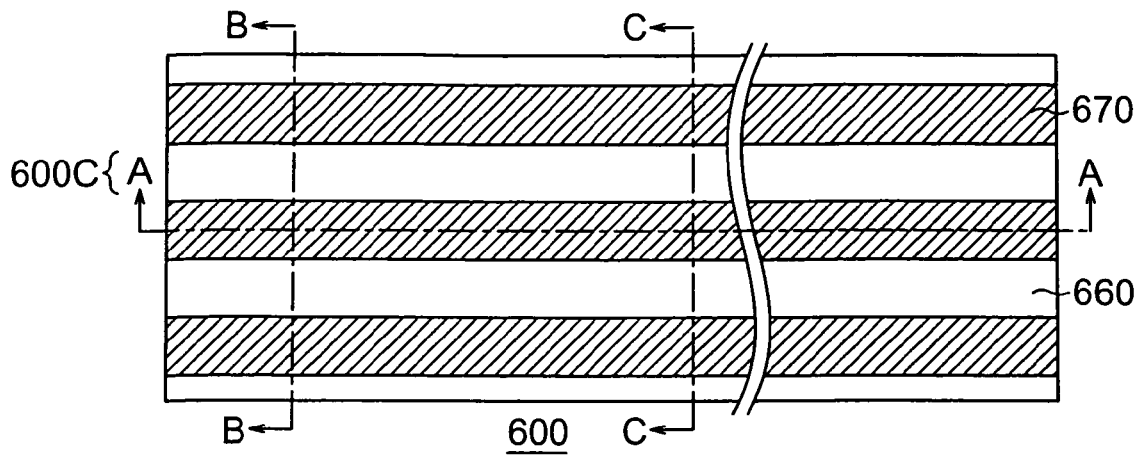
FIGS. 21(A) to 21(D) are a plan view, a longitudinal sectional view, and transverse sectional views, respectively, of the element specific to still another step of the manufacturing method for the NAND-type flash memory according to the embodiment of the present invention.
Figure 21B:
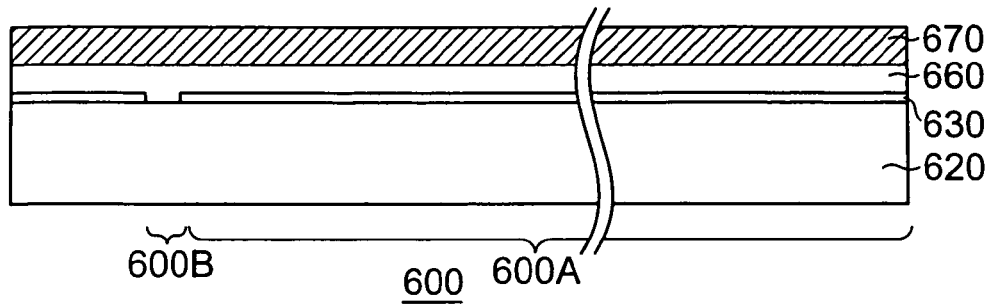
Figure 21C:
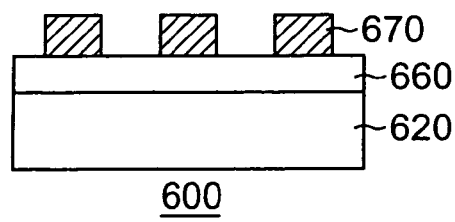
Figure 21D:
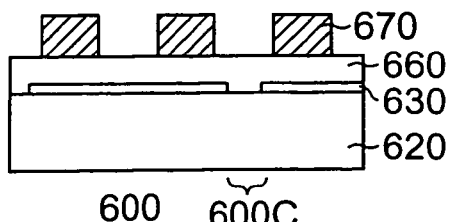
Figure 22A:
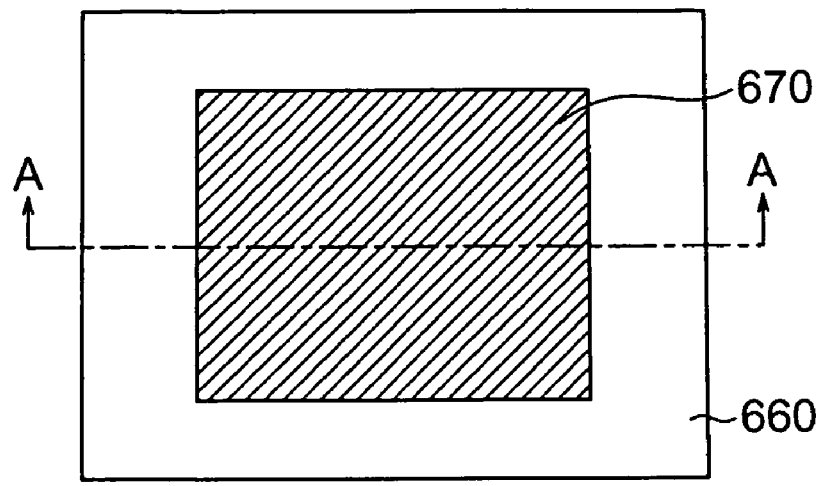
FIGS. 22(A) and 22(B) are a plan view and a longitudinal sectional view, respectively, of the element specific to the step of the manufacturing method for the NAND-type flash memory according to the embodiment of the present invention.
Figure 22B:
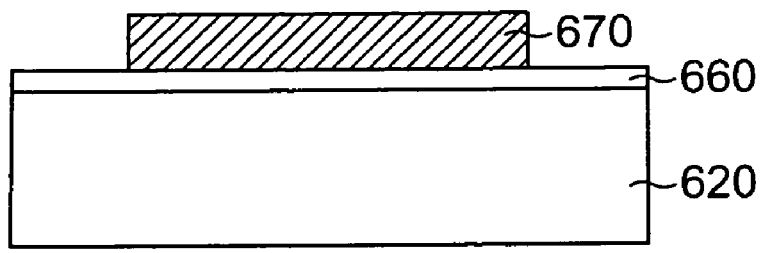
Figure 23A:
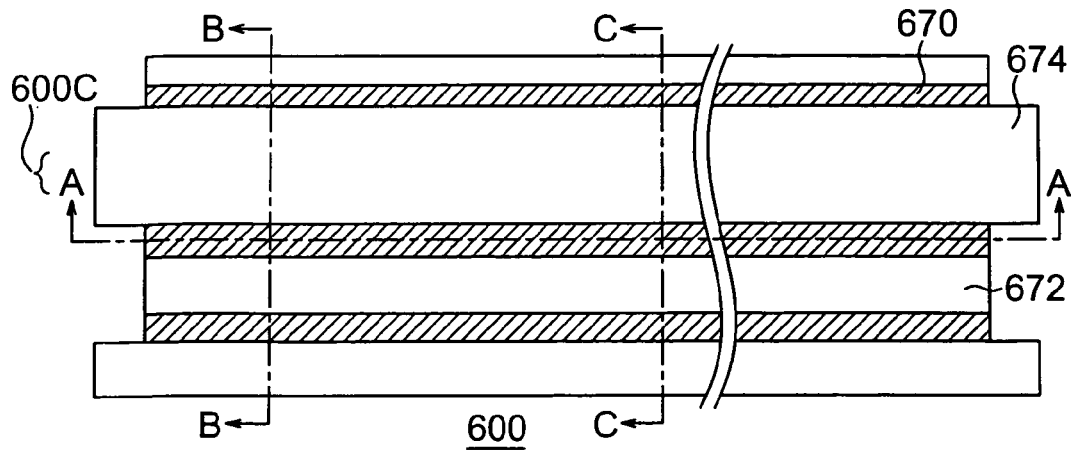
FIGS. 23(A) to 23(D) are a plan view, a longitudinal sectional view, and transverse sectional views, respectively, of the element specific to still another step of the manufacturing method for the NAND-type flash memory according to the embodiment of the present invention.
Figure 23B:
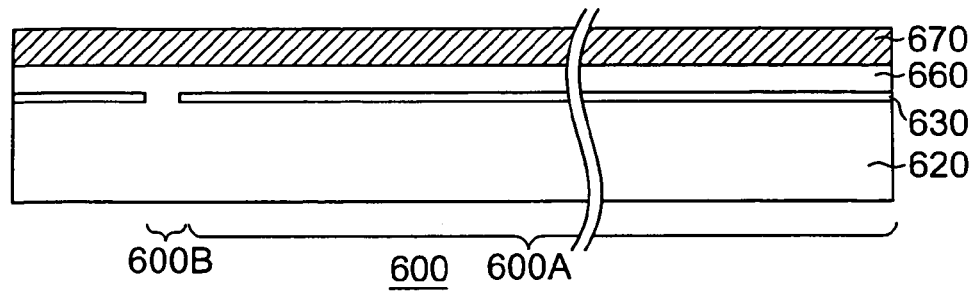
Figure 23C:
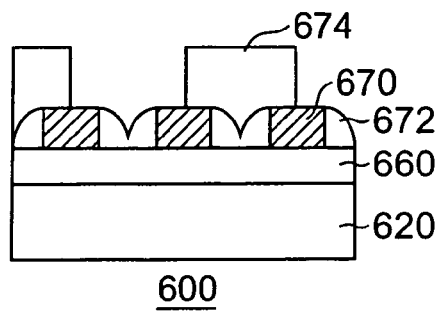
Figure 23D:
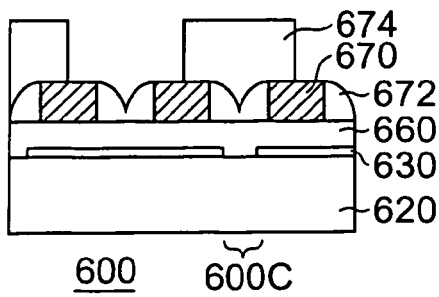
Figure 24A:
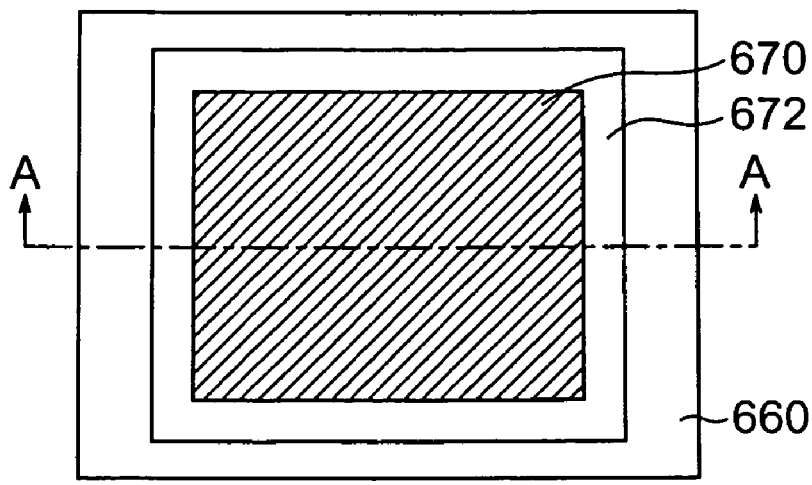
FIGS. 24(A) and 24(B) are a plan view and a longitudinal sectional view, respectively, of the element specific to the step of the manufacturing method for the NAND-type flash memory according to the embodiment of the present invention.
Figure 24B:
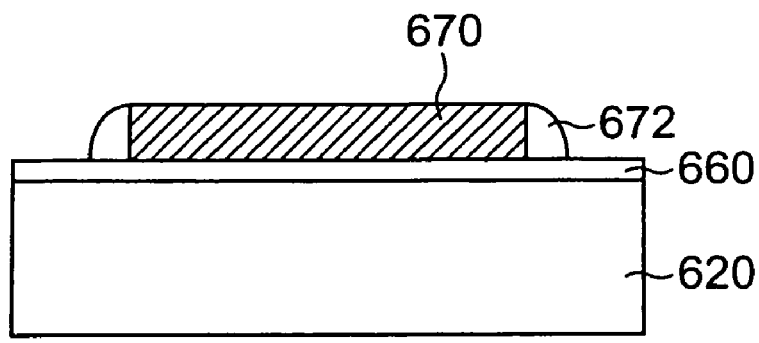
Figure 25A:
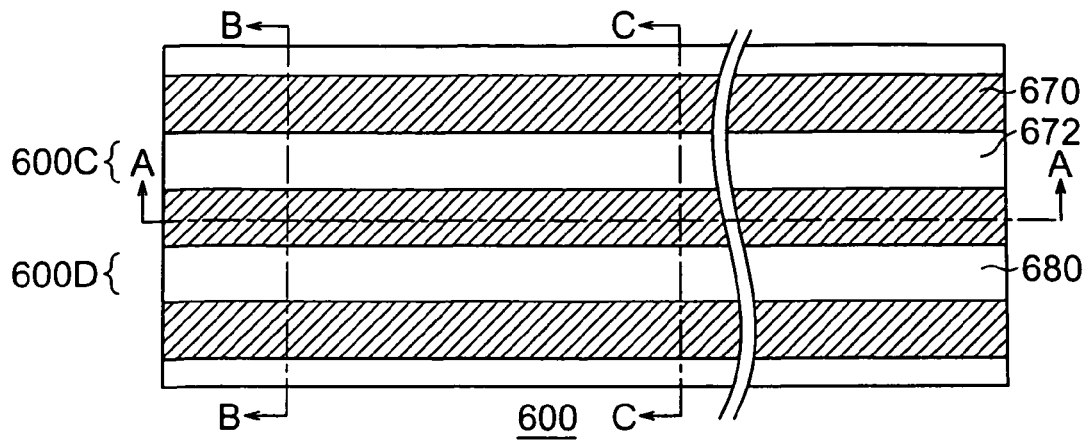
FIGS. 25(A) to 25(D) are a plan view, a longitudinal sectional view, and transverse sectional views, respectively, of the element specific to still another step of the manufacturing method for the NAND-type flash memory according to the embodiment of the present invention.
Figure 25B:
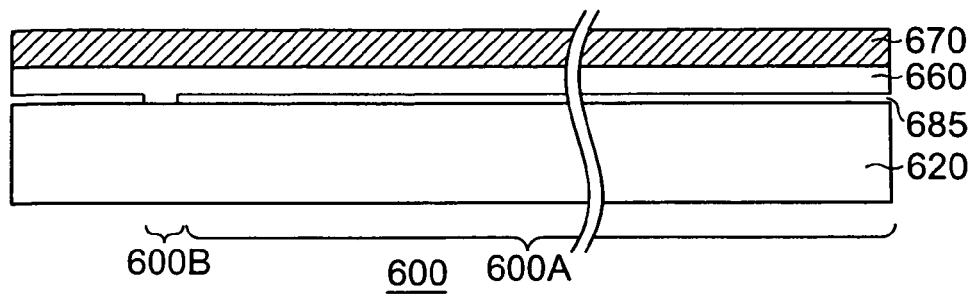
Figure 25C:
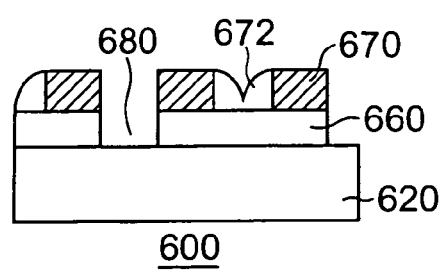
Figure 25D:
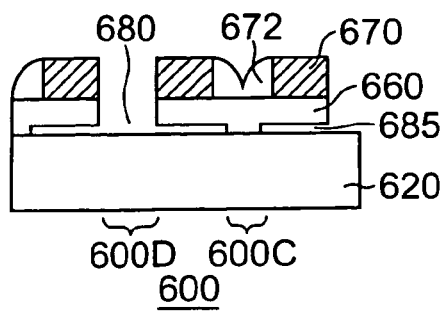
Figure 26A:
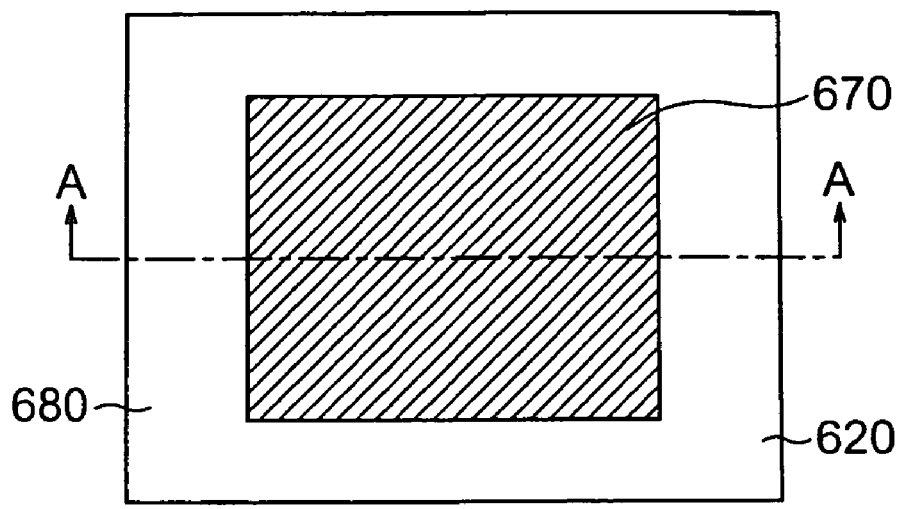
FIGS. 26(A) and 26(B) are a plan view and a longitudinal sectional view, respectively, of the element specific to the step of the manufacturing method for the NAND-type flash memory according to the embodiment of the present invention.
Figure 26B:
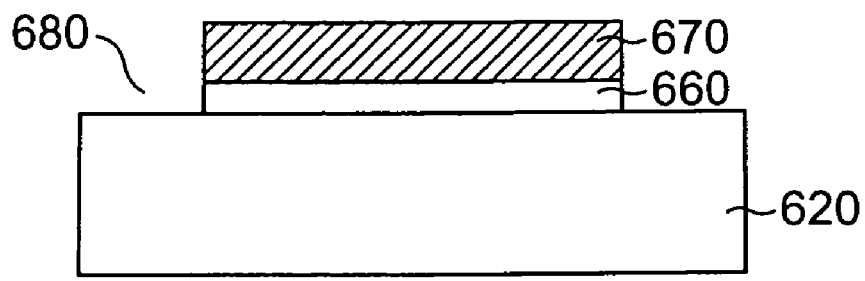
Figure 27A:
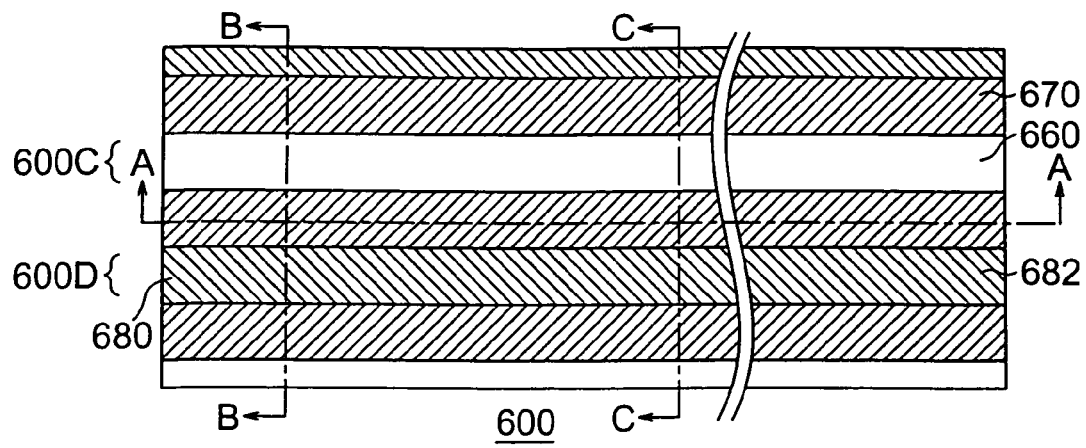
FIGS. 27(A) to 27(D) are a plan view, a longitudinal sectional view, and transverse sectional views, respectively, of the element specific to still another step of the manufacturing method for the NAND-type flash memory according to the embodiment of the present invention.
Figure 27B:
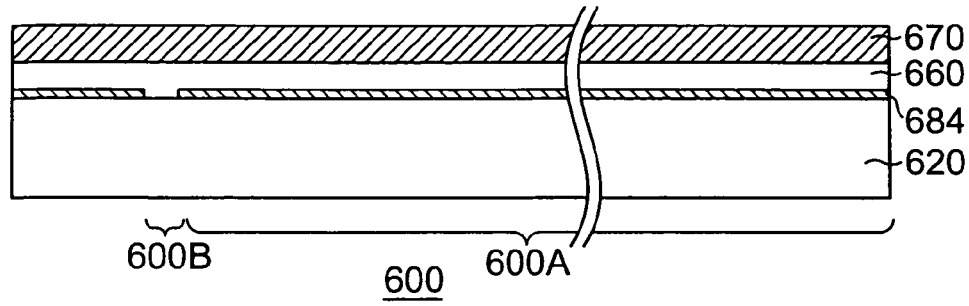
Figure 27C:
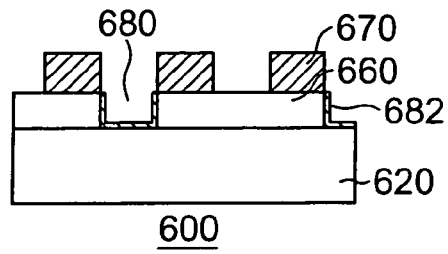
Figure 27D:
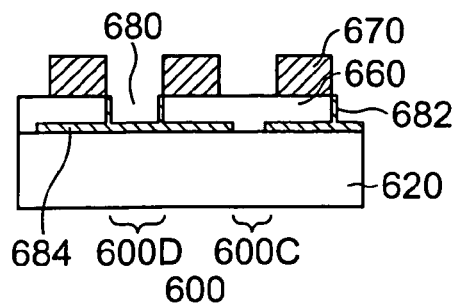
Figure 28A:
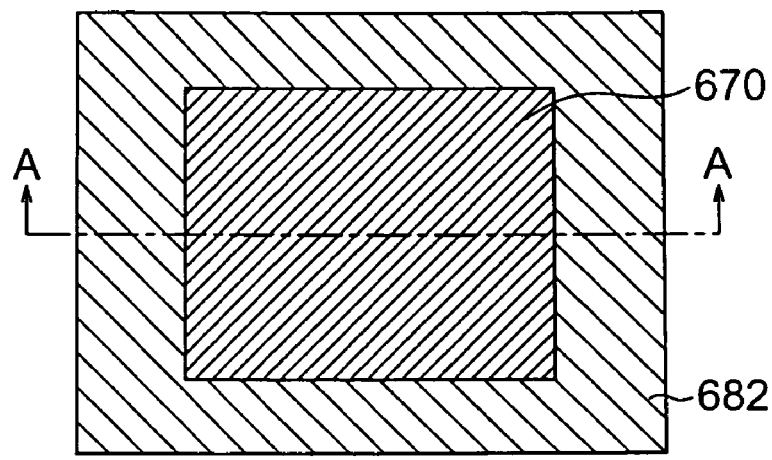
FIGS. 28(A) and 28(B) are a plan view and a longitudinal sectional view, respectively, of the element specific to the step of the manufacturing method for the NAND-type flash memory according to the embodiment of the present invention.
Figure 28B:
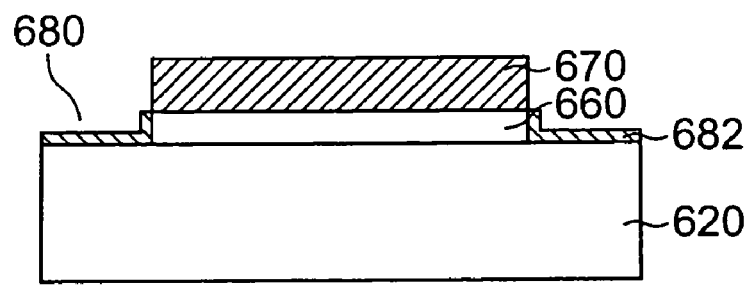
Figure 29A:
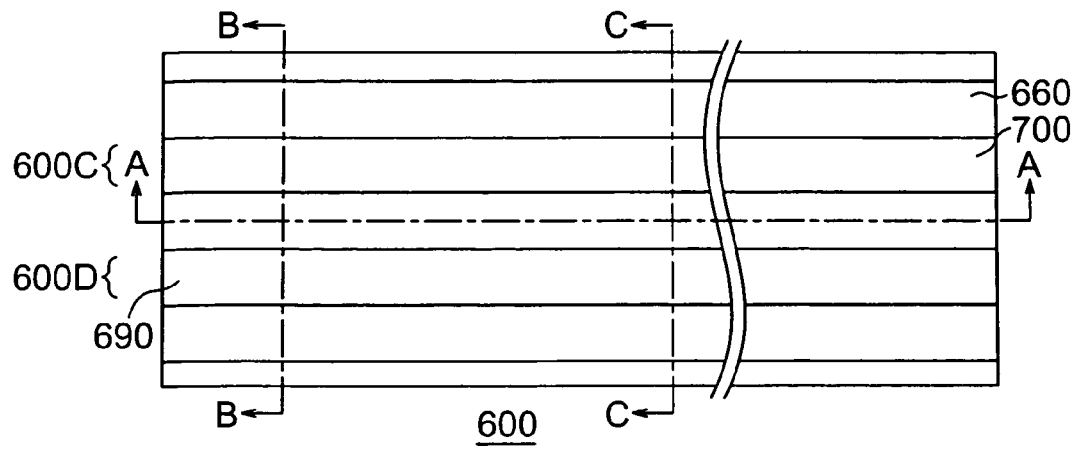
FIGS. 29(A) to 29(D) are a plan view, a longitudinal sectional view, and transverse sectional views, respectively, of the element specific to still another step of the manufacturing method for the NAND-type flash memory according to the embodiment of the present invention.
Figure 29B:
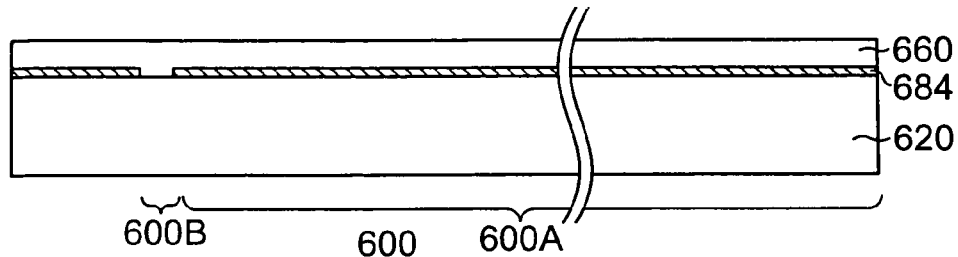
Figure 29C:
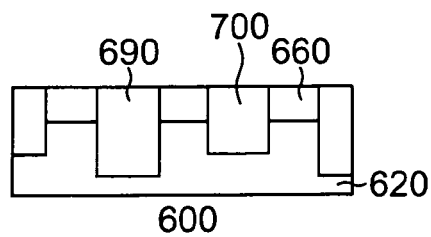
Figure 29D:
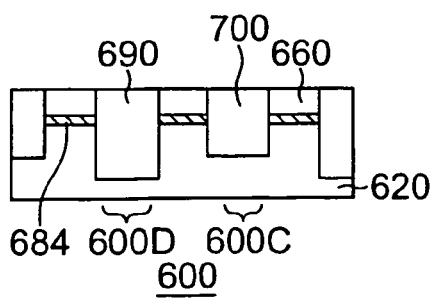
Figure 30A:
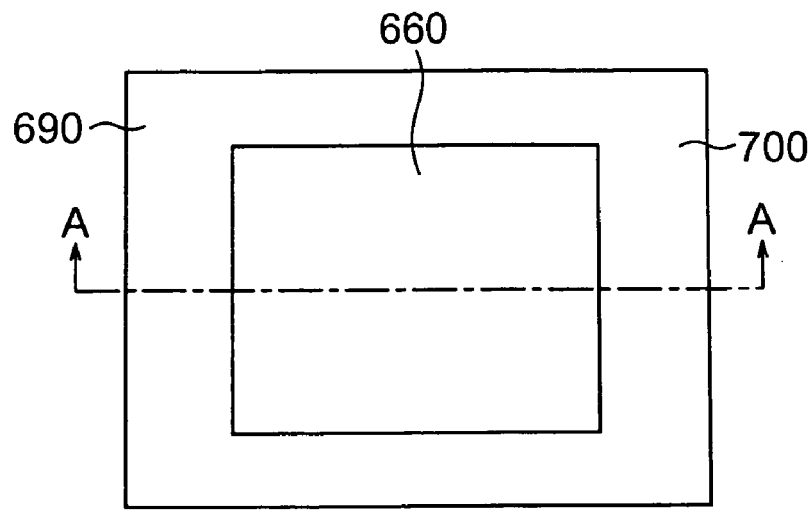
FIGS. 30(A) and 30(B) are a plan view and a longitudinal sectional view, respectively, of the element specific to the step of the manufacturing method for the NAND-type flash memory according to the embodiment of the present invention.
Figure 30B:
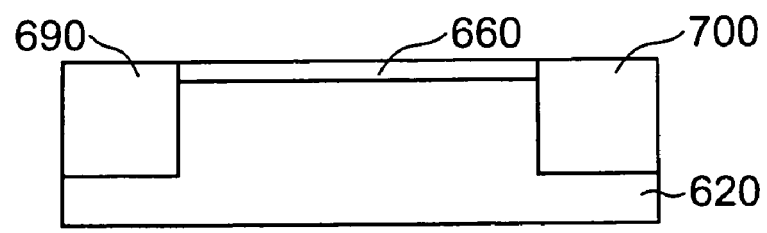
Figure 31A:
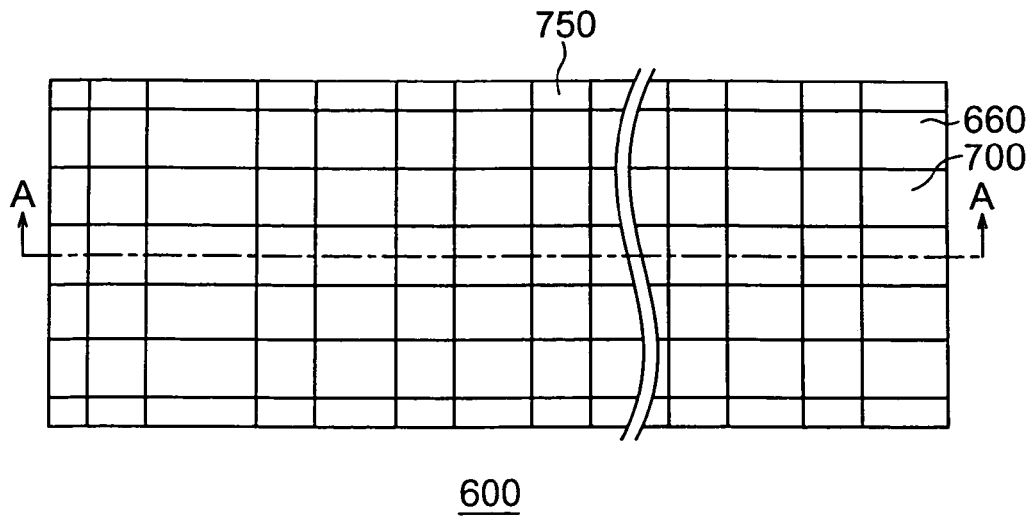
FIGS. 31(A) and 31(B) are a plan view and a longitudinal sectional view, respectively, of the element specific to still another step of the manufacturing method for the NAND-type flash memory according to the embodiment of the present invention.
Figure 31B:
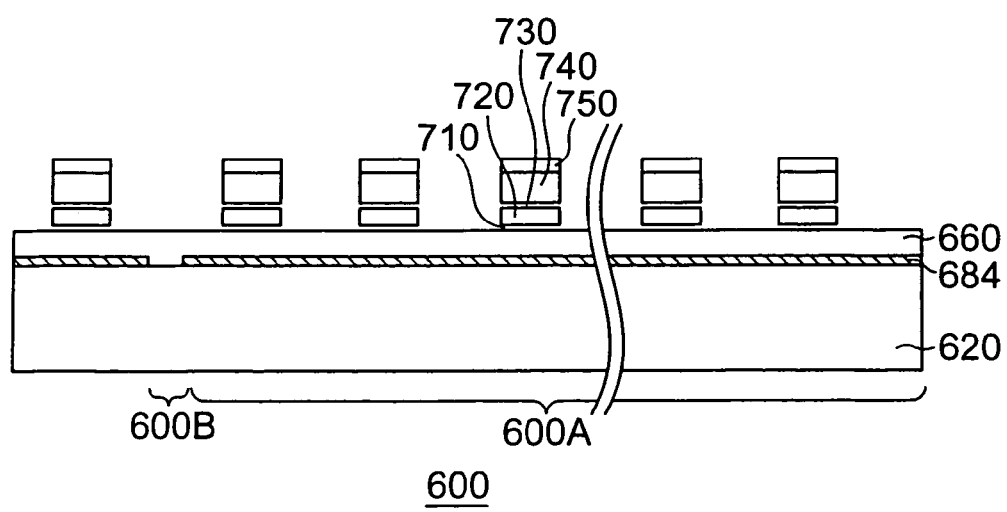
Figure 32A:
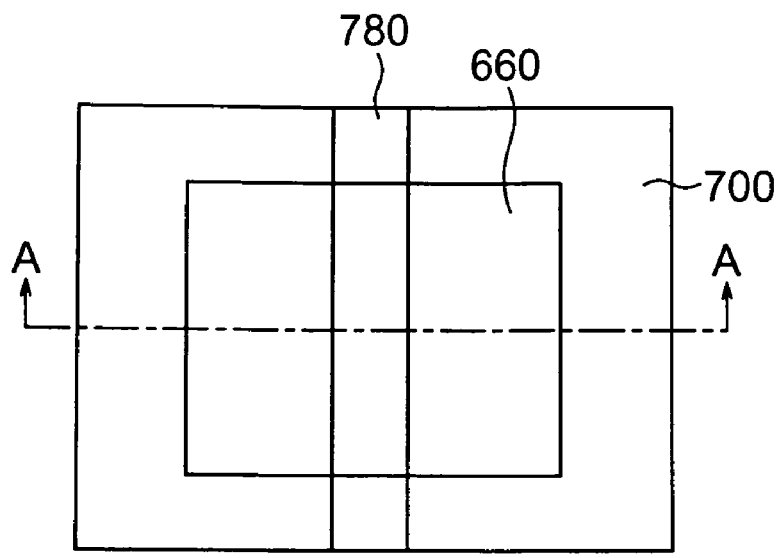
FIGS. 32(A) and 32(B) are a plan view and a longitudinal sectional view, respectively, of the element specific to the step of the manufacturing method for the NAND-type flash memory according to the embodiment of the present invention.
Figure 32B:
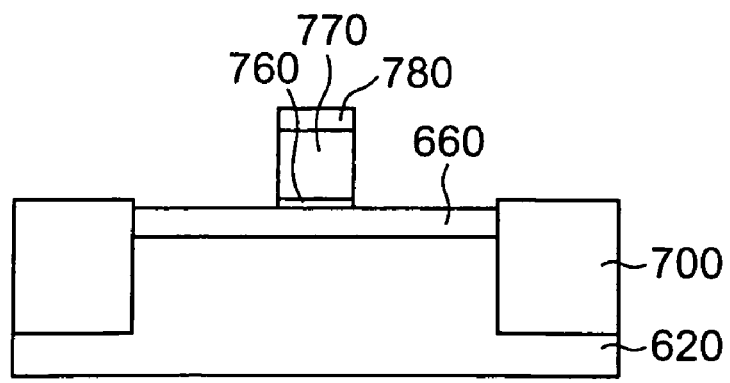

FIG. 16 shows the configuration of a part of a memory cell region 560 of a NAND-type flash memory according to a fifth embodiment of the present invention. Note that the same reference numerals denote the same components as those shown in FIGS. 1(A) and 1(B) and that an explanation thereof will be omitted.

In this embodiment, an N-type floating body 570 is formed. A depression-type memory cell transistor is used as a memory cell transistor MC.

This configuration reduces a gate threshold voltage. Accordingly, if a voltage applied to a control gate electrode 120 is the same, a cell current increases. This makes it possible to increase noise tolerance and improve the reliability of memory cell operation.

According to this embodiment, the same effects as those of the first embodiment can be obtained. More specifically, an SOI structure can be selectively formed in a memory cell region 560 of an ordinary semiconductor substrate 30 without using an SOI substrate. This makes it possible to improve memory cell characteristics while keeping production costs low.

Note that the above-described embodiments are merely examples and not intended to limit the present invention. More specifically, although a NAND-type flash memory is manufactured as a flash memory, any other flash memory having a structure in which a floating gate electrode and a control gate electrode are stacked, such as a NOR-type or AND-type one, may be manufactured instead.

A manufacturing method for a NAND-type flash memory according to another embodiment will be explained with reference to FIGS. 17(A) to 32(B).

Note that FIGS. 17(A), 19(A), 21(A), 23(A), 25(A), 27(A), 29(A), and 31(A) show plan views of a memory cell region 600 in an element as seen from above, specific to respective steps of the manufacturing method and that FIGS. 17(B), 19(B), 21(B), 23(B), 25(B), 27(B), 29(B), and 31(B) show longitudinal sectional views of the memory cell region 600 in the element taken along lines A-A, specific to the respective steps.

FIGS. 21(C), 23(C), 25(C), 27(C), and 29(C) show transverse sectional views of the memory cell region 600 taken along lines B-B, and FIGS. 21(D), 23(D), 25(D), 27(D), and 29(D) show transverse sectional views of the memory cell region 600 taken along lines C-C.

FIGS. 18(A), 20(A), 22(A), 24(A), 26(A), 28(A), 30(A), and 32(A) show plan views of a peripheral circuit region 610 in the element as seen from above, specific to the respective steps, and FIGS. 18(B), 20(B), 22(B), 24(B), 26(B), 28(B), 30(B), and 32(B) show longitudinal sectional views of the peripheral circuit region 610 taken along lines A-A.

As shown in FIGS. 17(A) and 17(B) and FIGS. 18(A) and 18(B), a silicon germanium (SiGe) layer 630 with a germanium (Ge) concentration of, e.g., 30% is formed as a layer to be removed all over a semiconductor substrate 620 to a thickness of, e.g., about 25 nm by epitaxial growth technique.

A silicon (Si) layer 640 is formed all over the silicon germanium layer 630 to a thickness of about 20 nm by epitaxial growth technique, and then, a silicon nitride (SiN) film 650 is formed all over the silicon layer 640.

The silicon nitride film 650 is patterned by lithography and RIE. With this operation, in the memory cell region 600, parts of the silicon nitride film 650 which are formed in a bit line contact plug formation region 600B and in, of element isolation insulating film formation regions, element isolation insulating film formation regions (to be referred to as support unit formation regions hereinafter) 600C arranged at predetermined intervals in the direction of a word line WL are removed, and in the peripheral circuit region 610, a part of the silicon nitride film 650 which is formed therein is removed.

Note that a support unit for supporting the silicon layer to be formed on the silicon germanium layer 630 later is formed in each support unit formation region 600C, as in the bit line contact plug formation region 600B. A CVD oxide film 655, for example, is then deposited all over the silicon nitride film 650, and the CVD oxide film 655 is partially removed by RIE such that parts thereof are left on sidewalls of the silicon nitride film 650.

As shown in FIGS. 19(A) and 19(B) and FIGS. 20(A) and 20(B), the silicon layer 640 and silicon germanium layer 630 are sequentially etched using the silicon nitride film 650 and CVD oxide film 655 as masks, thereby exposing a surface of the semiconductor substrate 620.

After the silicon nitride film 650 and CVD oxide film 655 are removed, a silicon layer 660 is formed all over the semiconductor substrate 620 and silicon layer 640 to, e.g., a thickness of 30 nm by epitaxial growth technique.

Note that at this time, the silicon layer 640 is used as a seed in a transistor formation region 600A of the memory cell region 600 except the support unit formation regions 600C and that the semiconductor substrate 620 is used as a seed in each of the contact plug formation region 600B and support unit formation regions 600C of the memory cell region 600 and the peripheral circuit region 610.

As shown in FIGS. 21(A) to 21(D) and FIGS. 22(A) and 22(B), a mask material 670 composed of, e.g., a silicon nitride film is deposited all over the silicon layer 660 and then patterned by lithography and RIE. With this operation, parts of the mask material 670 are left in regions which are to serve as element regions later.

As shown in FIGS. 23(A) to 23(D) and FIGS. 24(A) and 24(B), a CVD-BSG film 672, for example, is deposited all over the surface, and the CVD-BSG film 672 is partially removed by RIE such that parts thereof are left on sidewalls of the mask material 670. At this time, one of the parts of the CVD-BSG film 672 is also left on sidewalls of the part of the mask material 670 formed in the peripheral circuit region 610. After that, a photoresist is applied to the parts of the mask material 670 and those of the CVD-BSG film 672, and exposure and development are performed. With this operation, a resist mask 674 having a pattern corresponding to the support unit formation regions 600C is formed.

As shown in FIGS. 25(A) to 25(D) and FIGS. 26(A) and 26(B), the parts of the CVD-BSG film 672 formed in element isolation insulating film formation regions 600D (the element isolation insulating film formation regions except the support unit formation regions 600C) are removed by, e.g., HF (hydrofluoric acid) vapor using the resist mask 674 and the parts of the mask material 670 as masks.

The silicon layer 660 and silicon germanium layer 630 are sequentially etched using the resist mask 674 and the parts of the mask material 670 as masks, thereby forming trenches 680. At this time, side surfaces of the silicon germanium layer 630 are exposed at an inner surface of each trench 680.

The semiconductor substrate 620 is immersed in a predetermined etching solution. The silicon germanium layer 630 exposed at the inner surfaces of the trenches 680 is etched by wet etching and removed. Note that examples of the etching solution to be used here include SH (a mixed solution of sulfuric acid and hydrogen peroxide) and a mixed solution of TMY and hydrogen peroxide.

With this operation, cavities 685 are formed in regions from which the formed silicon germanium layer 630 has been removed. In this case, parts of the silicon layer 660 which are formed in the bit line contact plug formation region 600B and support unit formation regions 600C serve as support units which support a part of the silicon layer 660 which is formed in the transistor formation region 600A.

As shown in FIGS. 27(A) to 27(D) and FIGS. 28(A) and 28(B), the entire surfaces of the semiconductor substrate 620 and silicon layer 660 are oxidized. With this operation, a silicon oxide film 682 is formed on the inner surface of each trench 680, and the cavities 685 are filled with buried insulating films 684, each composed of a silicon oxide film. As described above, an SOI structure is selectively formed in the transistor formation region 600A of the memory cell region 600.

As shown in FIGS. 29(A) to 29(D) and FIGS. 30(A) and 30(B), the silicon layer 660, silicon oxide films 682, and semiconductor substrate 620 are sequentially etched using the parts of the mask material 670 as a mask, thereby forming element isolation trenches 690. Note that in this case, ones of the element isolation trenches 690 which are formed in the element isolation insulating film formation regions 600D (the element isolation insulating film formation regions except the support unit formation regions 600C) are deeper by the depth of each trench 680 than ones which are formed in the support unit formation regions 600C. Each element isolation trench 690 is filled with, e.g., a silicon oxide film by CVD, and the silicon oxide film is planarized, thereby forming an element isolation insulating film 700. After that, the mask material 670 is removed.

As shown in FIGS. 31(A) and 31(B) and FIGS. 32(A) and 32(B), in the memory cell region 600, a floating gate electrode 720 is formed above the silicon layer 660 via a tunnel insulating film 710, and a control gate electrode 740 is formed above the floating gate electrode 720 via an interelectrode insulating film 730. After that, a silicide 750 is formed on the control gate electrode 740. In the peripheral circuit region 610, after a gate electrode 770 is formed above the silicon layer 660 via a gate insulating film 760, a silicide 780 is formed on the gate electrode 770.

After that, although not shown, pairs of source and drain regions are formed by ion implantation, and an interlayer insulating film is formed all over the silicon layer 660 by CVD. A source line contact plug and a source line are formed, and a bit line contact plug and a bit line are formed in sequence. In this manner, the NAND-type flash memory is manufactured.

As described above, according to this embodiment, the part of the silicon layer 660 formed in the bit line contact plug formation region 600B and the parts of the silicon layer 660 formed in the support unit formation regions 600C serve as the support units, which support the part of the silicon layer 660 formed in the transistor formation region 600A.

Therefore, the mechanical strength of the silicon layer 660 when removing the silicon germanium layer 630 by wet etching (FIGS. 25(A) to 25(D)) can be made higher than that in the first embodiment. This makes it possible to inhibit collapse of the silicon layer 660 arranged above the cavities 685 formed by removing the silicon germanium layer 630 and generation of dust. Accordingly, yields can be increased.

According to this embodiment, the same effects as those of the first embodiment can be obtained. More specifically, an SOI structure can be selectively formed in the memory cell region 600 of the ordinary semiconductor substrate 620 without using an SOI substrate. This makes it possible to improve memory cell characteristics while keeping production costs low.

What is claimed is:

1. A NAND-type semiconductor storage device manufacturing method, comprising:
    forming a layer to be removed on a substrate;
    removing a part of the layer to be removed to expose a part of the substrate;
    forming a semiconductor layer on the exposed part of the substrate and the layer to be removed;
    forming a trench which reaches the substrate through the semiconductor layer to expose the layer to be removed on a side wall of the trench;
    removing the layer exposed on the side wall of the trench to form a cavity;
    forming a buried insulating film in the cavity;
    forming an element isolation insulating film in the trench;
    forming a first insulating film above a region where the buried insulating film is formed;
    forming a floating gate electrode on the first insulating film;
    forming a second insulating film on the floating gate electrode;
    forming a control electrode on the second insulating film; and
    forming a pair of diffusion layers in the semiconductor layer to have the floating gate electrode between the pair of diffusion layers.

2. The NAND-type semiconductor storage device manufacturing method according to claim 1, wherein when the layer to be removed is formed on the substrate, the layer to be removed is formed by epitaxially growing the layer to be removed on the substrate.

3. The NAND-type semiconductor storage device manufacturing method according to claim 1, wherein when the semiconductor layer is formed on the substrate and layer to be removed, the semiconductor layer is formed by epitaxially growing the semiconductor layer on the substrate and layer to be removed.

4. The NAND-type semiconductor storage device manufacturing method according to claim 1, wherein when the trench reaching the layer to be removed is formed, side surfaces of the layer to be removed are exposed at an inner surface of the trench by sequentially etching the semiconductor layer, layer to be removed, and substrate and forming the trench.

5. The NAND-type semiconductor storage device manufacturing method according to claim 1, wherein when the layer to be removed is removed, the layer to be removed is removed by etching the layer to be removed exposed at the inner surface of the trench by wet etching.

6. The NAND-type semiconductor storage device manufacturing method according to claim 1, wherein when the buried insulating film is formed in the cavity, the cavity is filled with the buried insulating film composed of a silicon oxide film by oxidizing an entire surface of the substrate.

7. The NAND-type semiconductor storage device manufacturing method according to claim 6, further comprising forming an element isolation insulating film in the trench after the buried insulating film is formed in the cavity.

8. The NAND-type semiconductor storage device manufacturing method according to claim 1, wherein when the buried insulating film is formed in the cavity, the buried insulating film is formed by filling the cavity with a silicon oxide film used to form an element isolation insulating film in the trench.

9. The NAND-type semiconductor storage device manufacturing method according to claim 1, wherein when the part of the layer to be removed is removed, a part of the layer to be removed which is formed in a bit line contact plug formation region and parts of the layer to be removed which are formed in, of element isolation insulating film formation regions, ones arranged at predetermined intervals in a direction of a word line are removed.

\* \* \* \* \*